United States Patent
Bower et al.

(10) Patent No.: US 9,818,725 B2
(45) Date of Patent: Nov. 14, 2017

(54) INORGANIC-LIGHT-EMITTER DISPLAY WITH INTEGRATED BLACK MATRIX

(71) Applicant: X-Celeprint Limited, Cork (IE)

(72) Inventors: Christopher Bower, Raleigh, NC (US); Willem Den Boer, Brighton, MI (US); Matthew Meitl, Durham, NC (US); Ronald S. Cok, Rochester, NY (US)

(73) Assignee: X-Celeprint Limited, Lee Maltings, Dyke Parade, Cork (IE)

( * ) Notice: Subject to any disclaimer, the term of this patent is extended or adjusted under 35 U.S.C. 154(b) by 0 days.

(21) Appl. No.: 14/818,201

(22) Filed: Aug. 4, 2015

(65) Prior Publication Data

US 2016/0351539 A1    Dec. 1, 2016

Related U.S. Application Data

(60) Provisional application No. 62/169,520, filed on Jun. 1, 2015.

(51) Int. Cl.
*H01L 29/18* (2006.01)
*H01L 25/065* (2006.01)
(Continued)

(52) U.S. Cl.
CPC ........ *H01L 25/0655* (2013.01); *H01L 25/167* (2013.01); *H01L 33/44* (2013.01);
(Continued)

(58) Field of Classification Search
CPC ... H01L 25/0655; H01L 25/167; H01L 33/54; H01L 33/58; H01L 33/62
(Continued)

(56) References Cited

U.S. PATENT DOCUMENTS 5,550,066 A    8/1996    Tang et al.
5,621,555 A    4/1997    Park
(Continued)

FOREIGN PATENT DOCUMENTS

EP    1662301 A1    5/2006
WO    WO-2006/027730 A1    3/2006
(Continued)

OTHER PUBLICATIONS

Roscher, H., VCSEL Arrays with Redundant Pixel Designs for 10Gbits/s 2-D Space-Parallel MMF Transmission, Annual Report, optoelectronics Department, (2005).
(Continued)

*Primary Examiner* — Mark Tornow
(74) *Attorney, Agent, or Firm* — William R. Haulbrook; Alexander D. Augst; Choate, Hall & Stewart LLP

(57) ABSTRACT

An inorganic-light-emitter display includes a display substrate and a plurality of spatially separated inorganic light emitters distributed on the display substrate in a light-emitter layer. A light-absorbing layer located on the display substrate in the light-emitter layer is in contact with the inorganic light emitters. Among other things, the disclosed technology provides improved angular image quality by avoiding parallax between the light emitters and the light-absorbing material, increased light-output efficiency by removing the light-absorbing material from the optical path, improved contrast by increasing the light-absorbing area of the display substrate, and a reduced manufacturing cost in a mechanically and environmentally robust structure using micro transfer printing.

15 Claims, 32 Drawing Sheets

(51) Int. Cl.
*H01L 25/16* (2006.01)
*H01L 33/44* (2010.01)
*H01L 33/58* (2010.01)
*H01L 33/62* (2010.01)

(52) U.S. Cl.
CPC .............. *H01L 33/58* (2013.01); *H01L 33/62* (2013.01); *H01L 2933/0025* (2013.01); *H01L 2933/0033* (2013.01); *H01L 2933/0066* (2013.01)

(58) Field of Classification Search
USPC ........................................ 349/61–63; 345/205
See application file for complete search history.

(56) References Cited

U.S. PATENT DOCUMENTS

| | | | |
|---|---|---|---|
| 5,815,303 | A | 9/1998 | Berlin |
| 5,994,722 | A | 11/1999 | Averbeck et al. |
| 6,084,579 | A | 7/2000 | Hirano |
| 6,087,680 | A * | 7/2000 | Gramann ............ H01L 25/0753 257/91 |
| 6,143,672 | A | 11/2000 | Ngo et al. |
| 6,169,294 | B1 | 1/2001 | Biing-Jye et al. |
| 6,184,477 | B1 | 2/2001 | Tanahashi |
| 6,278,242 | B1 | 8/2001 | Cok et al. |
| 6,392,340 | B2 | 5/2002 | Yoneda et al. |
| 6,403,985 | B1 | 6/2002 | Fan et al. |
| 6,410,942 | B1 | 6/2002 | Thibeault et al. |
| 6,466,281 | B1 | 10/2002 | Huang et al. |
| 6,504,180 | B1 | 1/2003 | Heremans et al. |
| 6,577,367 | B2 | 6/2003 | Kim |
| 6,660,457 | B1 | 12/2003 | Imai et al. |
| 6,703,780 | B2 | 3/2004 | Shiang et al. |
| 6,717,560 | B2 | 4/2004 | Cok et al. |
| 6,756,576 | B1 | 6/2004 | McElroy et al. |
| 6,812,637 | B2 | 11/2004 | Cok et al. |
| 6,828,724 | B2 | 12/2004 | Burroughes |
| 6,933,532 | B2 | 8/2005 | Arnold et al. |
| 6,975,369 | B1 * | 12/2005 | Burkholder ....... G02F 1/133603 349/61 |
| 7,009,220 | B2 | 3/2006 | Oohata |
| 7,012,382 | B2 | 3/2006 | Cheang et al. |
| 7,091,523 | B2 | 8/2006 | Cok et al. |
| 7,098,589 | B2 | 8/2006 | Erchak et al. |
| 7,129,457 | B2 | 10/2006 | McElroy et al. |
| 7,195,733 | B2 | 3/2007 | Rogers et al. |
| 7,288,753 | B2 | 10/2007 | Cok |
| 7,402,951 | B2 | 7/2008 | Cok |
| 7,420,221 | B2 | 9/2008 | Nagai |
| 7,466,075 | B2 | 12/2008 | Cok et al. |
| 7,521,292 | B2 | 4/2009 | Rogers et al. |
| 7,557,367 | B2 | 7/2009 | Rogers et al. |
| 7,586,497 | B2 | 9/2009 | Boroson et al. |
| 7,622,367 | B1 | 11/2009 | Nuzzo et al. |
| 7,662,545 | B2 | 2/2010 | Nuzzo et al. |
| 7,687,812 | B2 | 3/2010 | Louwsma et al. |
| 7,704,684 | B2 | 4/2010 | Rogers et al. |
| 7,791,271 | B2 | 9/2010 | Cok et al. |
| 7,799,699 | B2 | 9/2010 | Nuzzo et al. |
| 7,816,856 | B2 | 10/2010 | Cok et al. |
| 7,834,541 | B2 | 11/2010 | Cok |
| 7,872,722 | B2 | 1/2011 | Kimura |
| 7,893,612 | B2 | 2/2011 | Cok |
| 7,919,342 | B2 | 4/2011 | Cok |
| 7,927,976 | B2 | 4/2011 | Menard |
| 7,932,123 | B2 | 4/2011 | Rogers et al. |
| 7,943,491 | B2 | 5/2011 | Nuzzo et al. |
| 7,948,172 | B2 | 5/2011 | Cok et al. |
| 7,969,085 | B2 | 6/2011 | Cok |
| 7,972,875 | B2 | 7/2011 | Rogers et al. |
| 7,982,296 | B2 | 7/2011 | Nuzzo et al. |
| 7,990,058 | B2 | 8/2011 | Cok et al. |
| 7,999,454 | B2 | 8/2011 | Winters et al. |
| 8,029,139 | B2 | 10/2011 | Ellinger et al. |
| 8,039,847 | B2 | 10/2011 | Nuzzo et al. |
| 8,198,621 | B2 | 6/2012 | Rogers et al. |
| 8,207,547 | B2 | 6/2012 | Lin |
| 8,243,027 | B2 | 8/2012 | Hotelling et al. |
| 8,261,660 | B2 | 9/2012 | Menard |
| 8,288,843 | B2 | 10/2012 | Kojima et al. |
| 8,334,545 | B2 | 12/2012 | Levermore et al. |
| 8,394,706 | B2 | 3/2013 | Nuzzo et al. |
| 8,440,546 | B2 | 5/2013 | Nuzzo et al. |
| 8,450,927 | B2 | 5/2013 | Lenk et al. |
| 8,470,701 | B2 | 6/2013 | Rogers et al. |
| 8,502,192 | B2 | 8/2013 | Kwak et al. |
| 8,506,867 | B2 | 8/2013 | Menard |
| 8,619,011 | B2 | 12/2013 | Kimura |
| 8,664,699 | B2 | 3/2014 | Nuzzo et al. |
| 8,686,447 | B2 | 4/2014 | Tomoda et al. |
| 8,722,458 | B2 | 5/2014 | Rogers et al. |
| 8,735,932 | B2 | 5/2014 | Kim et al. |
| 8,754,396 | B2 | 6/2014 | Rogers et al. |
| 8,766,970 | B2 | 7/2014 | Chien et al. |
| 8,791,474 | B1 | 7/2014 | Bibl et al. |
| 8,794,501 | B2 | 8/2014 | Bibl et al. |
| 8,803,857 | B2 | 8/2014 | Cok |
| 8,817,369 | B2 | 8/2014 | Daiku |
| 8,854,294 | B2 | 10/2014 | Sakariya |
| 8,860,051 | B2 | 10/2014 | Fellows et al. |
| 8,877,648 | B2 | 11/2014 | Bower et al. |
| 8,884,844 | B2 | 11/2014 | Yang et al. |
| 8,889,485 | B2 | 11/2014 | Bower |
| 8,895,406 | B2 | 11/2014 | Rogers et al. |
| 8,902,152 | B2 | 12/2014 | Bai et al. |
| 8,946,760 | B2 | 2/2015 | Kim |
| 8,987,765 | B2 | 3/2015 | Bibl et al. |
| 9,105,813 | B1 | 8/2015 | Chang |
| 9,178,123 | B2 | 11/2015 | Sakariya et al. |
| 9,202,996 | B2 | 12/2015 | Orsley et al. |
| 9,308,649 | B2 | 4/2016 | Golda et al. |
| 9,412,977 | B2 | 8/2016 | Rohatgi |
| 9,437,782 | B2 | 9/2016 | Bower et al. |
| 9,444,015 | B2 | 9/2016 | Bower et al. |
| 9,520,537 | B2 | 12/2016 | Bower et al. |
| 2001/0022564 | A1 | 9/2001 | Youngquist et al. |
| 2002/0096994 | A1 | 7/2002 | Iwafuchi et al. |
| 2004/0180476 | A1 | 9/2004 | Kazlas et al. |
| 2004/0212296 | A1 | 10/2004 | Nakamura et al. |
| 2004/0227704 | A1 | 11/2004 | Wang et al. |
| 2004/0252933 | A1 | 12/2004 | Sylvester et al. |
| 2005/0006657 | A1 | 1/2005 | Terashita |
| 2005/0012076 | A1 | 1/2005 | Morioka |
| 2005/0116621 | A1 | 6/2005 | Bellmann et al. |
| 2005/0140275 | A1 | 6/2005 | Park |
| 2005/0168987 | A1 | 8/2005 | Tamaoki et al. |
| 2005/0264472 | A1 | 12/2005 | Rast |
| 2005/0275615 | A1 | 12/2005 | Kahen et al. |
| 2007/0035340 | A1 | 2/2007 | Kimura |
| 2007/0077349 | A1 | 4/2007 | Newman et al. |
| 2007/0201056 | A1 | 8/2007 | Cok et al. |
| 2008/0211734 | A1 | 9/2008 | Huitema et al. |
| 2009/0278142 | A1 | 11/2009 | Watanabe et al. |
| 2009/0315054 | A1 | 12/2009 | Kim et al. |
| 2010/0060553 | A1 * | 3/2010 | Zimmerman ....... H01L 25/0753 345/60 |
| 2010/0078670 | A1 | 4/2010 | Kim et al. |
| 2010/0123268 | A1 | 5/2010 | Menard |
| 2010/0148198 | A1 | 6/2010 | Sugizaki et al. |
| 2010/0186883 | A1 * | 7/2010 | Tomoda ............ H01L 25/0753 156/220 |
| 2010/0201253 | A1 | 8/2010 | Cok et al. |
| 2010/0214247 | A1 | 8/2010 | Tang et al. |
| 2010/0248484 | A1 | 9/2010 | Bower et al. |
| 2010/0258710 | A1 | 10/2010 | Wiese et al. |
| 2010/0317132 | A1 | 12/2010 | Rogers et al. |
| 2011/0242027 | A1 | 3/2011 | Chang |
| 2011/0211348 | A1 | 9/2011 | Kim |
| 2012/0119249 | A1 | 5/2012 | Kim et al. |
| 2012/0206428 | A1 | 8/2012 | Cok |
| 2012/0223875 | A1 | 9/2012 | Lau et al. |
| 2012/0228669 | A1 | 9/2012 | Bower et al. |
| 2012/0314388 | A1 | 12/2012 | Bower et al. |

(56) References Cited

U.S. PATENT DOCUMENTS

| | | |
|---|---|---|
| 2013/0015483 A1 | 1/2013 | Shimokawa et al. |
| 2013/0069275 A1 | 3/2013 | Menard et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0273695 A1 | 10/2013 | Menard et al. |
| 2014/0104243 A1 | 4/2014 | Sakariya et al. |
| 2014/0111442 A1 | 4/2014 | Cok et al. |
| 2014/0175498 A1 | 6/2014 | Lai |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0240617 A1 | 8/2014 | Fukutome et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0339495 A1 | 11/2014 | Bibl et al. |
| 2014/0367633 A1 | 12/2014 | Bibl et al. |
| 2014/0367705 A1 | 12/2014 | Bibl et al. |
| 2015/0135525 A1 | 5/2015 | Bower |
| 2015/0137153 A1 | 5/2015 | Bibl et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0373793 A1 | 12/2015 | Bower et al. |
| 2016/0005721 A1 | 1/2016 | Bower et al. |
| 2016/0018094 A1 | 1/2016 | Bower et al. |
| 2016/0064363 A1 | 3/2016 | Bower et al. |
| 2016/0093600 A1 | 3/2016 | Bower et al. |

FOREIGN PATENT DOCUMENTS

| | | |
|---|---|---|
| WO | WO-2006/099741 A1 | 9/2006 |
| WO | WO-2008/103931 A2 | 8/2008 |
| WO | WO-2010/032603 A1 | 3/2010 |
| WO | WO-2010/111601 A2 | 9/2010 |
| WO | WO-2010/132552 A1 | 11/2010 |
| WO | WO-2013/064800 A1 | 5/2013 |
| WO | WO-2014/121635 A1 | 8/2014 |
| WO | WO-2014/149864 A1 | 9/2014 |

OTHER PUBLICATIONS

Yaniv et al., A 640 × 480 Pixel Computer Display Using Pin Diodes with Device Redundancy, 1988 International Display Research Conference, IEEE, CH-2678-1/88:152-154 (1988).

Lee, S. H. etal, Laser Lift-Offof GaN Thin Film and its Application to the Flexible Light Emitting Diodes, Proc. of SPIE 8460:846011-1-846011-6 (2012).

Choi, H. W. et al., Efficient GaN-based Micro-LED Arrays, Mat. Res. Soc. Symp. Proc. 743:L6.28.1-L6.28.6 (2003).

Poher, V. et al., Micro-LED arrays: a tool for two-dimensional neuron stimulation, J. Phys. D: Appl. Phys. 41:094014 (2008).

\* cited by examiner

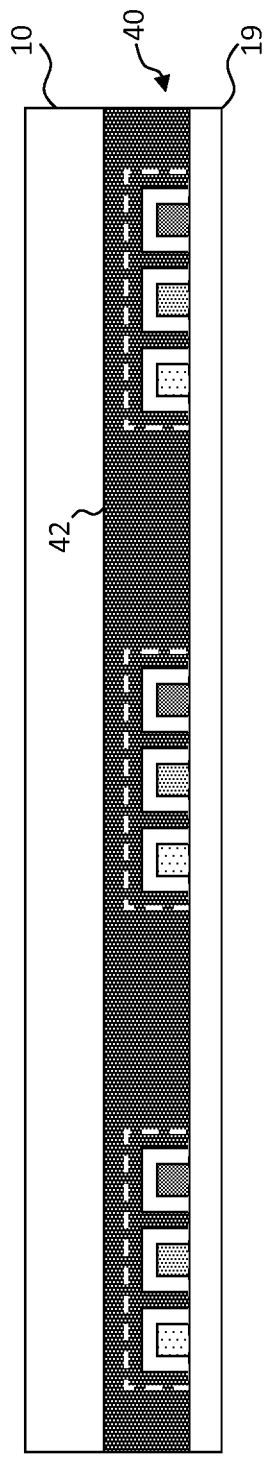

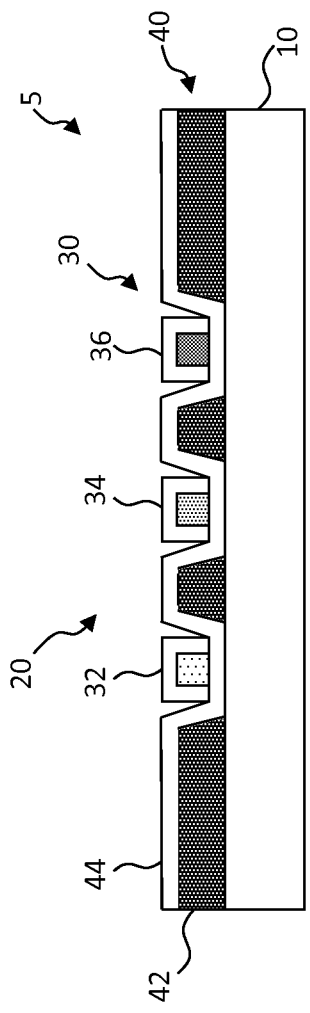
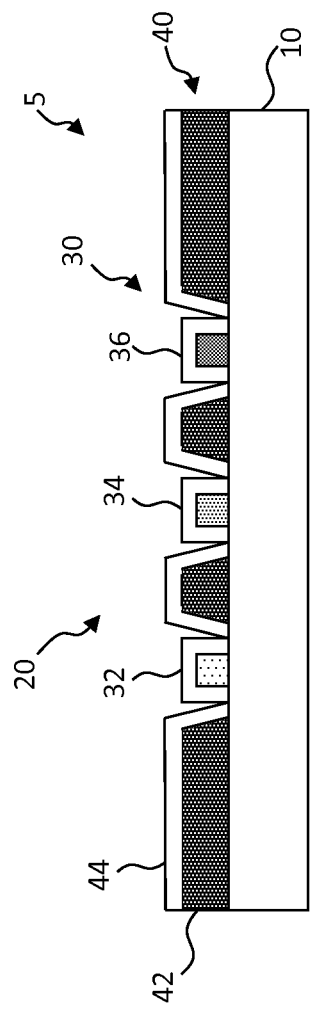
FIG. 32A
FIG. 32B

INORGANIC-LIGHT-EMITTER DISPLAY WITH INTEGRATED BLACK MATRIX

PRIORITY APPLICATION

This application claims priority to and the benefit of U.S. Provisional Patent Application No. 62/169,520, filed Jun. 1, 2015, titled "Inorganic-Light-Emitter Display with Integrated Black Matrix," the contents of which are incorporated by reference herein in its entirety.

FIELD OF THE INVENTION

The present invention relates to a display including inorganic light emitters and a black matrix for reducing ambient light reflections.

BACKGROUND OF THE INVENTION

Flat-panel displays are widely used in conjunction with computing devices, in portable devices, and for entertainment devices such as televisions. Such displays typically employ a plurality of pixels distributed over a display substrate to display images, graphics, or text. For example, liquid crystal displays (LCDs) employ liquid crystals to block or transmit light from a backlight behind the liquid crystals and organic light-emitting diode (OLED) displays rely on passing current through a layer of organic material that glows in response to the electrical current.

Most flat-panel displays are either reflective or emissive. Reflective displays, such as many e-paper displays and reflective LCDs do not emit light but rather each of the display pixels reflects or absorbs ambient light to form an image. Such displays cannot be viewed in the dark but excel in bright conditions such as a sunny day outdoors. In contrast, light-emissive displays emit light and can be viewed in the dark but are often difficult to view in bright conditions.

In order to improve the display contrast of light-emissive displays, display designers typically use anti-reflection layers on the front cover of displays and light-absorbing layers internal to the display to reduce ambient light reflection. For example, OLED displays often employ circular polarizers on the cover glass and LCDs use an ambient-light-absorbing black matrix in combination with color filters used to color the white light emitted by the LCD backlights. These black-matrix structures are either in a common structure with the color filters or between the viewer and the color filter. For example, U.S. Pat. No. 6,466,281 entitled Integrated black matrix/color filter structure for TFT-LCD describes a light-shielding layer located above the switching transistors in the display. U.S. Patent Application Publication No. 2007/0077349 entitled Patterning OLED Device Electrodes and Optical Material describes a black matrix integrated into an electrically insulating layer to absorb unwanted light in an RGBW configuration. Similarly, U.S. Pat. No. 7,402,951 entitled OLED Device having Improved Contrast discloses a contrast enhancement element with a light-absorbing layer for absorbing ambient light. U.S. Pat. No. 6,812,637, U.S. Pat. No. 7,466,075, and U.S. Pat. No. 7,091,523 all describe the use of black-matrix structures to improve contrast. These light-absorbing elements or layers are located between a viewer and the light-emitting OLED pixels.

Outdoor inorganic LED displays for public viewing are known to have black louvers associated with individual pixels to reduce glare from the sun. However, such displays are not capable of high resolution.

Inorganic LED displays are also known to use black-matrix structures, as disclosed in U.S. Pat. No. 7,919,342 entitled Patterned Inorganic LED Device in which a patterned conductive layer between and above the patterned light emitters can act as a black matrix to absorb light and increase the display contrast.

Black matrix structures in conventional displays locate light-absorbing elements or layers between a viewer and the light-emitting OLED pixels. Although such an arrangement can be relatively effective in absorbing ambient light, they also absorb emitted light and can create viewing-angle dependence for brightness. Such multi-layer structures are more complex and costly to manufacture and the additional layers can also absorb emitted light, reducing display efficiency. Thus, there remains a need for improvements in display systems, structures, and methods of manufacturing that provide improved image quality and contrast, emission efficiency, and a reduced manufacturing cost in a mechanically and environmentally robust structure.

SUMMARY OF THE INVENTION

The present invention provides a display having a plurality of spatially separated inorganic light emitters distributed over a display substrate in a light-emitter layer. A light-absorbing material is formed over the display substrate in the light-emitter layer and in contact with the inorganic light emitters. This arrangement provides the light emitters in a common layer with the light-absorbing material so that very little, if any, emitted light is absorbed by the light-absorbing material, improving the light output efficiency of the display. Moreover, since the light emitters are in a common layer with the light-absorbing material, there is no parallax between the light emitters and the light absorbing layer and thus no angular dependence on the light absorption or emission due to the light-absorbing material. Since an additional layer for incorporating the light-absorbing material is unnecessary, there is no further emitted light loss or additional manufacturing steps due to such an additional layer. Thus, the light-absorbing material absorbs ambient light but little or no emitted light.

The light emitters can be embedded in the light-absorbing material, providing additional robustness and environmental protection to the display. Furthermore, since an embodiment of the present invention uses micro-LEDs as the light emitters, the aperture ratio of the display can be relatively small and the light-absorbing material area is relatively large, contrary to prior-art displays, so that the ambient light is effectively absorbed by the light-absorbing material. Furthermore, in a small-aperture-ratio display using micro-LEDs, the problem of angular dependence for brightness due to parallax with a black matrix in a layer between the micro-LEDs and the viewer is particularly acute. According to embodiments of the present invention, because the light emitters are in a common layer with the light-absorbing material, this problem does not arise.

Among other things, the disclosed technology provides improved angular image quality by avoiding parallax between the light emitters and the light-absorbing material, increased light-output efficiency by removing the light-absorbing material from the optical path, improved contrast by increasing the light-absorbing area of the display substrate, and a reduced manufacturing cost in a mechanically and environmentally robust structure using micro transfer printing.

In one aspect, the disclosed technology includes an inorganic-light-emitter display, the display including: a display substrate; a plurality of spatially separated inorganic light emitters distributed on the display substrate in a light-emitter layer; and a light-absorbing material surrounding at least a portion of the plurality of inorganic light emitters in the light-emitter layer, wherein the light-absorbing material at least partially covers the display substrate.

In certain embodiments, the display includes a transparent adhesive layer located between the display substrate and the plurality of spatially separated inorganic light emitters that adheres the spatially separated inorganic light emitters to the display substrate.

In certain embodiments, the transparent adhesive layer is index-matched to the display substrate or to an element of the inorganic light emitters.

In certain embodiments, the transparent adhesive layer has a thickness that causes constructive optical interference for one or more of the frequencies of light emitted by the inorganic light emitters or that causes destructive optical interference for at least some frequencies of ambient light.

In certain embodiments, the display includes one or more pixel controllers located at least partially over the light-absorbing material and electrically connected to the inorganic light emitters.

In certain embodiments, the display includes one or more pixel controllers disposed on the display substrate, the pixel controllers connected to the inorganic light emitters with electrical connections, and the pixel controllers and the electrical connections located at least partially between the light-absorbing layer and the display substrate.

In certain embodiments, the display includes optical vias in the light-absorbing layer, the optical vias located at least partially in correspondence with the light-emitting areas of the inorganic light emitters.

In certain embodiments, the plurality of inorganic light emitters and the light-absorbing material are disposed on a common surface.

In certain embodiments, the inorganic light emitters include semiconductor layers and an electrically insulating layer disposed between the semiconductor layers and the light-absorbing material.

In certain embodiments, the light-emitter layer includes an electrically insulating layer disposed between the inorganic light emitters and the light-absorbing material.

In certain embodiments, the display includes an interlayer dielectric disposed between the inorganic light emitters and the light-absorbing material.

In certain embodiments, the display substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, the light-absorbing material is in contact with one or more of the light emitters of the plurality of light emitters.

In certain embodiments, the light-absorbing material is contiguous and surrounds the plurality of inorganic light emitters on the display substrate.

In certain embodiments, the light-absorbing material is a curable resin that includes a light-absorbing dye or pigment.

In certain embodiments, the display substrate has a transparency greater than or equal to 50%, 80%, 90%, or 95% for visible light.

In certain embodiments, the inorganic light emitters are inorganic light-emitting diodes.

In certain embodiments, each of the plurality of inorganic light emitters is a light-emitting diode with a width from 2 to 5 µm, 5 to 10 µm, 10 to 20 µm, or 20 to 50 µm.

In certain embodiments, each of the plurality of inorganic light emitters is a light-emitting diode with a length from 2 to 5 µm, 5 to 10 µm, 10 to 20 µm, or 20 to 50 µm.

In certain embodiments, each of the plurality of inorganic light emitters is a light-emitting diode with a height from 2 to 5 µm, 4 to 10 µm, 10 to 20 µm, or 20 to 50 µm.

In certain embodiments, the display includes a plurality of pixels, each pixel comprising one or more of the plurality of inorganic light emitters.

In certain embodiments, each pixel of the plurality of pixels has inorganic light emitters that emit different colors of light.

In certain embodiments, the plurality of light emitters includes: a plurality of red micro inorganic light-emitting diodes, a plurality of green micro inorganic light-emitting diodes, and a plurality of blue micro inorganic light-emitting diodes, wherein each pixel of the plurality of pixels comprises a red micro inorganic light-emitting diode of the plurality of red micro inorganic light-emitting diodes, a green micro inorganic light-emitting diode of the plurality of green micro inorganic light-emitting diodes, and a blue micro inorganic light-emitting diode of the plurality of blue micro inorganic light-emitting diodes.

In certain embodiments, the plurality of light emitters comprise a plurality of yellow light emitters, and each pixel of the plurality of pixels comprises a yellow micro inorganic light-emitting diode of the plurality of yellow micro inorganic light-emitting diodes.

In certain embodiments, each pixel of the plurality of pixels is spatially separated from two or more adjacent pixels by a first distance, each pixel comprises two or more inorganic light emitters of the plurality of inorganic light emitters, each of the two or more inorganic light emitters with a pixel are spatially separated from an adjacent inorganic light emitter within the pixel by a second distance, and the first distance is greater than the second distance.

In certain embodiments, the plurality of pixels forms an array.

In certain embodiments, the light-absorbing material is within the spatial area encompassed by the plurality of pixels.

In certain embodiments, the display substrate is transparent and the plurality of inorganic light emitters are disposed on the display substrate to emit light through the display substrate.

In certain embodiments, the inorganic light emitters emit light in a direction opposite the display substrate.

In certain embodiments, each light emitter of the plurality of inorganic light emitters has a light-emissive area and wherein the combined light-emissive areas of the plurality of inorganic light emitters is less than or equal to one eighth, one tenth, one twentieth, one fiftieth, one hundredth, one two-hundredth, one five-hundredth, one thousandth, or one ten-thousandth of the light-absorbing material area.

In certain embodiments, at least one or more of the plurality of inorganic light emitters is at least partially between the light-absorbing material and the display substrate.

In certain embodiments, the light-absorbing material covers a display area of the display substrate.

In certain embodiments, the display includes electrically conductive wires formed on or over the display substrate and electrically connected to the inorganic light emitters.

In certain embodiments, the wires are located between the light-absorbing material and the display substrate and comprising a light filter between the wires and the display substrate.

In certain embodiments, the light filter is a dichroic filter.

In certain embodiments, the light filter is a black metal, is carbon, or is carbon black.

In certain embodiments, the light-absorbing material includes multiple layers of light-absorbing material and the wires are located between the layers.

In certain embodiments, the display includes an anti-reflection layer located between the plurality of inorganic light emitters and a viewer.

In certain embodiments, the light-absorbing material absorbs ambient light transmitted through the display substrate.

In certain embodiments, the display substrate is a polymer, plastic, resin, polyimide, PEN, PET, metal, metal foil, glass, a semiconductor, or sapphire.

In certain embodiments, the display substrate is flexible.

In certain embodiments, the display includes a protection layer located between the light emitters and a viewer.

In certain embodiments, the display includes a removal layer located on a side of the light-absorbing material opposite the display substrate.

In certain embodiments, the display includes vias formed in the light-absorbing material where the light-absorbing material overlaps the plurality of light emitters.

In certain embodiments, the light-absorbing material is deposited by spin, curtain, or hopper coating the display substrate with the light-absorbing material.

In certain embodiments, the display includes a plurality of pixel substrates separate from the display substrate and wherein each of the plurality of inorganic light emitters are located on one of the plurality of pixel substrates and the plurality of pixel substrates are located on the display substrate.

In certain embodiments, the pixel substrate includes a material selected from the group consisting of a semiconductor material, plastic, glass, metal, or a combination thereof.

In certain embodiments, the common surface on which the plurality of light emitters and the light-absorbing material are formed is a planar surface.

In certain embodiments, the display substrate has two opposing smooth sides.

In certain embodiments, the plurality of inorganic light emitters are non-native to the display substrate.

In certain embodiments, the inorganic light emitters include semiconductor layers and an electrically insulating layer disposed between the semiconductor layers and the light-absorbing material.

In certain embodiments, the light-emitter layer includes an electrically insulating layer disposed between the inorganic light emitters and the light-absorbing material.

In certain embodiments, the display includes an interlayer dielectric disposed between the inorganic light emitters and the light-absorbing material.

In another aspect, the display includes a display substrate; a light-absorbing material in contact with the display substrate; and a plurality of inorganic light emitters distributed on a side of the light-absorbing material opposite the display substrate.

In certain embodiments, the plurality of inorganic light emitters distributed on the light-absorbing material are at least partially embedded in the light-absorbing material.

In certain embodiments, the display includes one or more pixel controllers connected to the inorganic light emitters on the side of the light-absorbing material opposite the display substrate.

In certain embodiments, the light-absorbing material forms a first layer and comprising a second layer of light-absorbing material on the first layer, the pixel controllers and the connections.

In certain embodiments, the display includes inorganic light emitter optical vias in the second layer.

In certain embodiments, a surface of each of the plurality of inorganic light emitters are flush with a surface of the light-absorbing material.

In certain embodiments, the display substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, the light-absorbing material is in contact with one or more of the light emitters of the plurality of light emitters.

In certain embodiments, the light-absorbing material is contiguous and surrounds the plurality of inorganic light emitters on the display substrate.

In certain embodiments, the light-absorbing material is a curable resin that includes a light-absorbing dye or pigment.

In certain embodiments, the display substrate has a transparency greater than or equal to 50%, 80%, 90%, or 95% for visible light.

In certain embodiments, the inorganic light emitters are inorganic light-emitting diodes.

In certain embodiments, each of the plurality of inorganic light emitters is a light-emitting diode with a width from 2 to 5 μm, 5 to 10 μm, 10 to 20 μm, or 20 to 50 μm.

In certain embodiments, each of the plurality of inorganic light emitters is a light-emitting diode with a length from 2 to 5 μm, 5 to 10 μm, 10 to 20 μm, or 20 to 50 μm.

In certain embodiments, each of the plurality of inorganic light emitters is a light-emitting diode with a height from 2 to 5 μm, 4 to 10 μm, 10 to 20 μm, or 20 to 50 μm.

In certain embodiments, the display includes a plurality of pixels, each pixel comprising one or more of the plurality of inorganic light emitters.

In certain embodiments, each pixel of the plurality of pixels has inorganic light emitters that emit different colors of light.

In certain embodiments, the plurality of light emitters includes: a plurality of red micro inorganic light-emitting diodes, a plurality of green micro inorganic light-emitting diodes, and a plurality of blue micro inorganic light-emitting diodes, wherein each pixel of the plurality of pixels comprises a red micro inorganic light-emitting diode of the plurality of red micro inorganic light-emitting diodes, a green micro inorganic light-emitting diode of the plurality of green micro inorganic light-emitting diodes, and a blue micro inorganic light-emitting diode of the plurality of blue micro inorganic light-emitting diodes.

In certain embodiments, the plurality of light emitters comprise a plurality of yellow light emitters, and each pixel of the plurality of pixels comprises a yellow micro inorganic light-emitting diode of the plurality of yellow micro inorganic light-emitting diodes.

In certain embodiments, each pixel of the plurality of pixels is spatially separated from two or more adjacent pixels by a first distance, each pixel comprises two or more inorganic light emitters of the plurality of inorganic light emitters, each of the two or more inorganic light emitters with a pixel are spatially separated from an adjacent inorganic light emitter within the pixel by a second distance, and the first distance is greater than the second distance.

In certain embodiments, the plurality of pixels forms an array.

In certain embodiments, the light-absorbing material is within the spatial area encompassed by the plurality of pixels.

In certain embodiments, the display substrate is transparent and the plurality of inorganic light emitters are disposed on the display substrate to emit light through the display substrate.

In certain embodiments, the inorganic light emitters emit light in a direction opposite the display substrate.

In certain embodiments, each light emitter of the plurality of inorganic light emitters has a light-emissive area and wherein the combined light-emissive areas of the plurality of inorganic light emitters is less than or equal to one eighth, one tenth, one twentieth, one fiftieth, one hundredth, one two-hundredth, one five-hundredth, one thousandth, or one ten-thousandth of the light-absorbing material area.

In certain embodiments, at least one or more of the plurality of inorganic light emitters is at least partially between the light-absorbing material and the display substrate.

In certain embodiments, the light-absorbing material covers a display area of the display substrate.

In certain embodiments, the display includes electrically conductive wires formed on or over the display substrate and electrically connected to the inorganic light emitters.

In certain embodiments, the wires are located between the light-absorbing material and the display substrate and comprising a light filter between the wires and the display substrate.

In certain embodiments, the light filter is a dichroic filter.

In certain embodiments, the light filter is a black metal, is carbon, or is carbon black.

In certain embodiments, the light-absorbing material includes multiple layers of light-absorbing material and the wires are located between the layers.

In certain embodiments, the display includes an anti-reflection layer located between the plurality of inorganic light emitters and a viewer.

In certain embodiments, the light-absorbing material absorbs ambient light transmitted through the display substrate.

In certain embodiments, the display substrate is a polymer, plastic, resin, polyimide, PEN, PET, metal, metal foil, glass, a semiconductor, or sapphire.

In certain embodiments, the display substrate is flexible.

In certain embodiments, the display includes a protection layer located between the light emitters and a viewer.

In certain embodiments, the display includes a removal layer located on a side of the light-absorbing material opposite the display substrate.

In certain embodiments, the display includes vias formed in the light-absorbing material where the light-absorbing material overlaps the plurality of light emitters.

In certain embodiments, the light-absorbing material is deposited by spin, curtain, or hopper coating the display substrate with the light-absorbing material.

In certain embodiments, the display includes a plurality of pixel substrates separate from the display substrate and wherein each of the plurality of inorganic light emitters are located on one of the plurality of pixel substrates and the plurality of pixel substrates are located on the display substrate.

In certain embodiments, the pixel substrate includes a material selected from the group consisting of a semiconductor material, plastic, glass, metal, or a combination thereof.

In certain embodiments, the common surface on which the plurality of light emitters and the light-absorbing material are formed is a planar surface.

In certain embodiments, the display substrate has two opposing smooth sides.

In certain embodiments, the plurality of inorganic light emitters are non-native to the display substrate.

In certain embodiments, the inorganic light emitters include semiconductor layers and an electrically insulating layer disposed between the semiconductor layers and the light-absorbing material.

In certain embodiments, the light-emitter layer includes an electrically insulating layer disposed between the inorganic light emitters and the light-absorbing material.

In certain embodiments, the display includes an interlayer dielectric disposed between the inorganic light emitters and the light-absorbing material.

In another aspect, the disclosed technology includes a method of micro assembling a micro light-emitting diode (LED) display, the method including: providing a plurality of inorganic light emitters; micro transfer printing the plurality of inorganic light emitters onto a display substrate such that the plurality of inorganic light emitters are spatially separated on the display substrate in a light-emitter layer; and depositing a light-absorbing material on the display substrate in the light-emitter layer and surrounding at least a portion of the plurality of inorganic light emitters, thereby forming a light-absorbing layer on the display substrate.

In certain embodiments, the plurality of inorganic light emitters and the light-absorbing material are disposed on a common surface.

In certain embodiments, the plurality of inorganic light emitters distributed on the light-absorbing material are at least partially embedded in the light-absorbing material.

In certain embodiments, a top surface of each of the plurality of inorganic light emitters are flush with a top surface of the light-absorbing material.

In certain embodiments, the plurality of inorganic light emitters are non-native to the display substrate.

In certain embodiments, the light-absorbing material is in contract with one or more of the light emitters of the plurality of light emitters.

In certain embodiments, the display substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, the light-absorbing material is contiguous and surrounds the plurality of inorganic light emitters on the display substrate.

In certain embodiments, the light-absorbing material is a curable resin that includes a light-absorbing dye or pigment.

In certain embodiments, the inorganic light emitters are inorganic light-emitting diodes.

In certain embodiments, display substrate has a transparency greater than or equal to 50%, 80%, 90%, or 95% for visible light.

In certain embodiments, each of the plurality of inorganic light emitters is a light-emitting diode with a width from 2 to 5 µm, 5 to 10 µm, 10 to 20 µm, or 20 to 50 µm.

In certain embodiments, each of the plurality of inorganic light emitters is a light-emitting diode with a length from 2 to 5 µm, 5 to 10 µm, 10 to 20 µm, or 20 to 50 µm.

In certain embodiments, each of the plurality of inorganic light emitters is a light-emitting diode with a height from 2 to 5 μm, 4 to 10 μm, 10 to 20 μm, or 20 to 50 μm.

In certain embodiments, the display includes a plurality of pixels, each pixel including one or more of the plurality of inorganic light emitters.

In certain embodiments, each pixel of the plurality of pixels has inorganic light emitters that emit different colors of light.

In certain embodiments, the plurality of light emitters includes: a plurality of red micro inorganic light-emitting diodes, a plurality of green micro inorganic light-emitting diodes, and a plurality of blue micro inorganic light-emitting diodes, wherein each pixel of the plurality of pixels comprises a red micro inorganic light-emitting diode of the plurality of red micro inorganic light-emitting diodes, a green micro inorganic light-emitting diode of the plurality of green micro inorganic light-emitting diodes, and a blue micro inorganic light-emitting diode of the plurality of blue micro inorganic light-emitting diodes.

In certain embodiments, the plurality of light emitters comprise a plurality of yellow light emitters, and each pixel of the plurality of pixels comprises a yellow micro inorganic light-emitting diode of the plurality of yellow micro inorganic light-emitting diodes.

In certain embodiments, each pixel of the plurality of pixels is spatially separated from two or more adjacent pixels by a first distance, each pixel comprises two or more inorganic light emitters of the plurality of inorganic light emitters, each of the two or more inorganic light emitters within a pixel are spatially separated from an adjacent inorganic light emitter within the pixel by a second distance, and the first distance is greater than the second distance.

In certain embodiments, the plurality of pixels forms an array.

In certain embodiments, the light-absorbing material is within the spatial area encompassed by the plurality of pixels.

In certain embodiments, the display substrate is transparent and the plurality of inorganic light emitters are disposed on the display substrate to emit light through the display substrate.

In certain embodiments, the inorganic light emitters emit light in a direction opposite the display substrate.

In certain embodiments, each light emitter of the plurality of inorganic light emitters has a light-emissive area and wherein the combined light-emissive areas of the plurality of inorganic light emitters is less than or equal to one eighth, one tenth, one twentieth, one fiftieth, one hundredth, one two-hundredth, one five-hundredth, one thousandth, or one ten-thousandth of the light-absorbing material area.

In certain embodiments, the plurality of inorganic light emitters are at least partially between the light-absorbing material and the display substrate.

In certain embodiments, the light-absorbing material covers display area of the display substrate.

In certain embodiments, the display includes electrically conductive wires formed on or over the display substrate and electrically connected to the inorganic light emitters.

In certain embodiments, the wires are located between the light-absorbing material and the display substrate and comprising a light filter between the wires and the display substrate.

In certain embodiments, the light filter is a dichroic filter.

In certain embodiments, the light filter is a black metal, is carbon, or is carbon black.

In certain embodiments, the light-absorbing material includes multiple layers of light-absorbing material and the wires are located between the layers.

In certain embodiments, the display includes an anti-reflection layer located between the plurality of light emitters and a viewer.

In certain embodiments, the light-absorbing material absorbs ambient light transmitted through the display substrate.

In certain embodiments, the display substrate is a polymer, plastic, resin, polyimide, PEN, PET, metal, metal foil, glass, a semiconductor, or sapphire.

In certain embodiments, the display substrate is flexible.

In certain embodiments, the display includes a protection layer located between the light emitters and a viewer.

In certain embodiments, the display includes a removal layer located on a side of the light-absorbing material opposite the display substrate.

In certain embodiments, the method includes forming vias in the light-absorbing material where the light-absorbing material overlaps the plurality of light emitters.

In certain embodiments, the light-absorbing material is deposited by spin, curtain, or hopper coating the display substrate with the light-absorbing material.

In certain embodiments, the method includes providing a plurality of pixel substrates separate from the display substrate and wherein each of the plurality of inorganic light emitters are located on one of the plurality of pixel substrates and the plurality of pixel substrates are located on the display substrate.

In certain embodiments, the pixel substrate includes a material selected from the group consisting of a semiconductor material, plastic, glass, metal, or a combination thereof.

In certain embodiments, the common surface on which the plurality of light emitters and the light-absorbing material are formed is a planar surface.

In certain embodiments, the display substrate has two opposing smooth sides.

In certain embodiments, the display substrate is non-native to the plurality of inorganic light emitters.

In another aspect, the disclosed technology includes a method of micro assembling a micro light-emitting diode (LED) display, the method including: providing a plurality of inorganic light emitters; depositing a light-absorbing material on a display substrate, thereby forming a light-absorbing layer on the display substrate; and micro transfer printing the plurality of inorganic light emitters onto the light-absorbing material.

In certain embodiments, the light-absorbing material forms a first layer and depositing a second layer of light-absorbing material on the first layer and at least partially between the inorganic light emitters.

In certain embodiments, the light-absorbing material forms a first layer and depositing a second layer of light-absorbing material on the first layer and at least partially over the light-emitting areas of one or more inorganic light emitters to at least partially obscure the light-emitting areas of the one or more inorganic light emitters, and forming optical vias in the second layer over the partially obscured light-emitting areas.

In certain embodiments, the method includes disposing one or more pixel controllers on the light-absorbing layer and electrically connecting the pixel controllers to one or more of the inorganic light emitters.

In certain embodiments, the light-absorbing material forms a first layer and depositing a second layer of light-absorbing material on the first layer and at least partially over the pixel controllers and electrical connections.

In certain embodiments, the light-absorbing material forms a first layer and depositing a second layer of light-absorbing material on the first layer, at least partially over the pixel controllers and electrical connections, and at least partially over the light-emitting areas of one or more inorganic light emitters to at least partially obscure the light-emitting areas of the one or more inorganic light emitters, and forming optical vias in the second layer over the partially obscured light-emitting areas.

In certain embodiments, the second layer includes curable light-absorbing materials and comprising recording the locations of the light-emitting areas of the inorganic light emitters and curing the second layers in the non-light-emitting areas to form the optical vias.

In certain embodiments, the plurality of inorganic light emitters distributed on the light-absorbing material are at least partially embedded in the light-absorbing material.

In certain embodiments, a top surface of each of the plurality of inorganic light emitters are flush with a top surface of the light-absorbing material.

In certain embodiments, the plurality of inorganic light emitters are non-native to the display substrate.

In certain embodiments, the light-absorbing material is in contract with one or more of the light emitters of the plurality of light emitters.

In certain embodiments, the display substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, the light-absorbing material is contiguous and surrounds the plurality of inorganic light emitters on the display substrate.

In certain embodiments, the light-absorbing material is a curable resin that includes a light-absorbing dye or pigment.

In certain embodiments, the inorganic light emitters are inorganic light-emitting diodes.

In certain embodiments, display substrate has a transparency greater than or equal to 50%, 80%, 90%, or 95% for visible light.

In certain embodiments, each of the plurality of inorganic light emitters is a light-emitting diode with a width from 2 to 5 µm, 5 to 10 µm, 10 to 20 µm, or 20 to 50 µm.

In certain embodiments, each of the plurality of inorganic light emitters is a light-emitting diode with a length from 2 to 5 µm, 5 to 10 µm, 10 to 20 µm, or 20 to 50 µm.

In certain embodiments, each of the plurality of inorganic light emitters is a light-emitting diode with a height from 2 to 5 µm, 4 to 10 µm, 10 to 20 µm, or 20 to 50 µm.

In certain embodiments, the display includes a plurality of pixels, each pixel including one or more of the plurality of inorganic light emitters.

In certain embodiments, each pixel of the plurality of pixels has inorganic light emitters that emit different colors of light.

In certain embodiments, the plurality of light emitters includes: a plurality of red micro inorganic light-emitting diodes, a plurality of green micro inorganic light-emitting diodes, and a plurality of blue micro inorganic light-emitting diodes, wherein each pixel of the plurality of pixels comprises a red micro inorganic light-emitting diode of the plurality of red micro inorganic light-emitting diodes, a green micro inorganic light-emitting diode of the plurality of green micro inorganic light-emitting diodes, and a blue micro inorganic light-emitting diode of the plurality of blue micro inorganic light-emitting diodes.

In certain embodiments, the plurality of light emitters comprise a plurality of yellow light emitters, and each pixel of the plurality of pixels comprises a yellow micro inorganic light-emitting diode of the plurality of yellow micro inorganic light-emitting diodes.

In certain embodiments, each pixel of the plurality of pixels is spatially separated from two or more adjacent pixels by a first distance, each pixel comprises two or more inorganic light emitters of the plurality of inorganic light emitters, each of the two or more inorganic light emitters within a pixel are spatially separated from an adjacent inorganic light emitter within the pixel by a second distance, and the first distance is greater than the second distance.

In certain embodiments, the plurality of pixels forms an array.

In certain embodiments, the light-absorbing material is within the spatial area encompassed by the plurality of pixels.

In certain embodiments, the display substrate is transparent and the plurality of inorganic light emitters are disposed on the display substrate to emit light through the display substrate.

In certain embodiments, the inorganic light emitters emit light in a direction opposite the display substrate.

In certain embodiments, each light emitter of the plurality of inorganic light emitters has a light-emissive area and wherein the combined light-emissive areas of the plurality of inorganic light emitters is less than or equal to one eighth, one tenth, one twentieth, one fiftieth, one hundredth, one two-hundredth, one five-hundredth, one thousandth, or one ten-thousandth of the light-absorbing material area.

In certain embodiments, the plurality of inorganic light emitters are at least partially between the light-absorbing material and the display substrate.

In certain embodiments, the light-absorbing material covers display area of the display substrate.

In certain embodiments, the display includes electrically conductive wires formed on or over the display substrate and electrically connected to the inorganic light emitters.

In certain embodiments, the wires are located between the light-absorbing material and the display substrate and comprising a light filter between the wires and the display substrate.

In certain embodiments, the light filter is a dichroic filter.

In certain embodiments, the light filter is a black metal, is carbon, or is carbon black.

In certain embodiments, the light-absorbing material includes multiple layers of light-absorbing material and the wires are located between the layers.

In certain embodiments, the display includes an anti-reflection layer located between the plurality of light emitters and a viewer.

In certain embodiments, the light-absorbing material absorbs ambient light transmitted through the display substrate.

In certain embodiments, the display substrate is a polymer, plastic, resin, polyimide, PEN, PET, metal, metal foil, glass, a semiconductor, or sapphire.

In certain embodiments, the display substrate is flexible.

In certain embodiments, the display includes a protection layer located between the light emitters and a viewer.

In certain embodiments, the display includes a removal layer located on a side of the light-absorbing material opposite the display substrate.

In certain embodiments, the method includes forming vias in the light-absorbing material where the light-absorbing material overlaps the plurality of light emitters.

In certain embodiments, the light-absorbing material is deposited by spin, curtain, or hopper coating the display substrate with the light-absorbing material.

In certain embodiments, the method includes providing a plurality of pixel substrates separate from the display substrate and wherein each of the plurality of inorganic light emitters are located on one of the plurality of pixel substrates and the plurality of pixel substrates are located on the display substrate.

In certain embodiments, the pixel substrate includes a material selected from the group consisting of a semiconductor material, plastic, glass, metal, or a combination thereof.

In certain embodiments, the common surface on which the plurality of light emitters and the light-absorbing material are formed is a planar surface.

In certain embodiments, the display substrate has two opposing smooth sides.

In certain embodiments, the display substrate is non-native to the plurality of inorganic light emitters.

In another aspect, the disclosed technology includes a method of micro assembling a micro light-emitting diode (LED) display, the method including: providing a plurality of inorganic light emitters; micro transfer printing the plurality of inorganic light emitters onto a handle substrate; depositing a light-absorbing material on the handle substrate such the light-absorbing material covers and surrounds at least a portion of the plurality of inorganic light emitters; and removing the handle substrate.

In certain embodiments, the handle substrate is non-native to the plurality of inorganic light emitters.

In certain embodiments, the plurality of inorganic light emitters distributed on the light-absorbing material are at least partially embedded in the light-absorbing material.

In certain embodiments, a top surface of each of the plurality of inorganic light emitters are flush with a top surface of the light-absorbing material.

In certain embodiments, the plurality of inorganic light emitters are non-native to the display substrate.

In certain embodiments, the light-absorbing material is in contract with one or more of the light emitters of the plurality of light emitters.

In certain embodiments, the display substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, the light-absorbing material is contiguous and surrounds the plurality of inorganic light emitters on the display substrate.

In certain embodiments, the light-absorbing material is a curable resin that includes a light-absorbing dye or pigment.

In certain embodiments, the inorganic light emitters are inorganic light-emitting diodes.

In certain embodiments, display substrate has a transparency greater than or equal to 50%, 80%, 90%, or 95% for visible light.

In certain embodiments, each of the plurality of inorganic light emitters is a light-emitting diode with a width from 2 to 5 µm, 5 to 10 µm, 10 to 20 µm, or 20 to 50 µm.

In certain embodiments, each of the plurality of inorganic light emitters is a light-emitting diode with a length from 2 to 5 µm, 5 to 10 µm, 10 to 20 µm, or 20 to 50 µm.

In certain embodiments, each of the plurality of inorganic light emitters is a light-emitting diode with a height from 2 to 5 µm, 4 to 10 µm, 10 to 20 µm, or 20 to 50 µm.

In certain embodiments, the display includes a plurality of pixels, each pixel including one or more of the plurality of inorganic light emitters.

In certain embodiments, each pixel of the plurality of pixels has inorganic light emitters that emit different colors of light.

In certain embodiments, the plurality of light emitters includes: a plurality of red micro inorganic light-emitting diodes, a plurality of green micro inorganic light-emitting diodes, and a plurality of blue micro inorganic light-emitting diodes, wherein each pixel of the plurality of pixels comprises a red micro inorganic light-emitting diode of the plurality of red micro inorganic light-emitting diodes, a green micro inorganic light-emitting diode of the plurality of green micro inorganic light-emitting diodes, and a blue micro inorganic light-emitting diode of the plurality of blue micro inorganic light-emitting diodes.

In certain embodiments, the plurality of light emitters comprise a plurality of yellow light emitters, and each pixel of the plurality of pixels comprises a yellow micro inorganic light-emitting diode of the plurality of yellow micro inorganic light-emitting diodes.

In certain embodiments, each pixel of the plurality of pixels is spatially separated from two or more adjacent pixels by a first distance, each pixel comprises two or more inorganic light emitters of the plurality of inorganic light emitters, each of the two or more inorganic light emitters within a pixel are spatially separated from an adjacent inorganic light emitter within the pixel by a second distance, and the first distance is greater than the second distance.

In certain embodiments, the plurality of pixels forms an array.

In certain embodiments, the light-absorbing material is within the spatial area encompassed by the plurality of pixels.

In certain embodiments, the display substrate is transparent and the plurality of inorganic light emitters are disposed on the display substrate to emit light through the display substrate.

In certain embodiments, the inorganic light emitters emit light in a direction opposite the display substrate.

In certain embodiments, each light emitter of the plurality of inorganic light emitters has a light-emissive area and wherein the combined light-emissive areas of the plurality of inorganic light emitters is less than or equal to one eighth, one tenth, one twentieth, one fiftieth, one hundredth, one two-hundredth, one five-hundredth, one thousandth, or one ten-thousandth of the light-absorbing material area.

In certain embodiments, the plurality of inorganic light emitters are at least partially between the light-absorbing material and the display substrate.

In certain embodiments, the light-absorbing material covers display area of the display substrate.

In certain embodiments, the display includes electrically conductive wires formed on or over the display substrate and electrically connected to the inorganic light emitters.

In certain embodiments, the wires are located between the light-absorbing material and the display substrate and comprising a light filter between the wires and the display substrate.

In certain embodiments, the light filter is a dichroic filter.

In certain embodiments, the light filter is a black metal, is carbon, or is carbon black.

In certain embodiments, the light-absorbing material includes multiple layers of light-absorbing material and the wires are located between the layers.

In certain embodiments, the display includes an anti-reflection layer located between the plurality of light emitters and a viewer.

In certain embodiments, the light-absorbing material absorbs ambient light transmitted through the display substrate.

In certain embodiments, the display substrate is a polymer, plastic, resin, polyimide, PEN, PET, metal, metal foil, glass, a semiconductor, or sapphire.

In certain embodiments, the display substrate is flexible.

In certain embodiments, the display includes a protection layer located between the light emitters and a viewer.

In certain embodiments, the display includes a removal layer located on a side of the light-absorbing material opposite the display substrate.

In certain embodiments, the method includes forming vias in the light-absorbing material where the light-absorbing material overlaps the plurality of light emitters.

In certain embodiments, the light-absorbing material is deposited by spin, curtain, or hopper coating the display substrate with the light-absorbing material.

In certain embodiments, the method includes providing a plurality of pixel substrates separate from the display substrate and wherein each of the plurality of inorganic light emitters are located on one of the plurality of pixel substrates and the plurality of pixel substrates are located on the display substrate.

In certain embodiments, the pixel substrate includes a material selected from the group consisting of a semiconductor material, plastic, glass, metal, or a combination thereof.

In certain embodiments, the common surface on which the plurality of light emitters and the light-absorbing material are formed is a planar surface.

In certain embodiments, the display substrate has two opposing smooth sides.

In certain embodiments, the display substrate is non-native to the plurality of inorganic light emitters.

In another aspect, the disclosed technology includes a method of micro assembling a micro light-emitting diode (LED) display, the method includes: providing a plurality of inorganic light emitters; disposing a transparent adhesive layer on a display substrate; micro transfer printing the plurality of inorganic light emitters onto the transparent adhesive layer such that the plurality of inorganic light emitters are spatially separated on the display substrate in a light-emitter layer; and depositing a light-absorbing material on the display substrate in the light-emitter layer and surrounding at least a portion of the plurality of inorganic light emitters, thereby forming a light-absorbing layer on the display substrate.

In certain embodiments, the method includes disposing one or more pixel controllers on the light-absorbing layer and electrically connecting the pixel controllers to one or more of the inorganic light emitters.

In another aspect, the disclosed technology includes a method of micro assembling a micro light-emitting diode (LED) display, the method including: providing a plurality of inorganic light emitters and one or more pixel controllers; disposing the pixel controllers on a display substrate together with one or more electrical interconnections; micro transfer printing the plurality of inorganic light emitters onto the display substrate and the electrical interconnections such that the plurality of inorganic light emitters are connected to the pixel controllers and are spatially separated on the display substrate in a light-emitter layer; and depositing a light-absorbing material on the display substrate in the light-emitter layer and surrounding at least a portion of the plurality of inorganic light emitters, thereby forming a light-absorbing layer on the display substrate.

In certain embodiments, the light-absorbing layer at least partially obscures at least a portion of the light-emitting areas of one or more inorganic light emitters and comprising forming optical vias in the light-absorbing layer.

In another aspect, the disclosed technology includes a method of micro assembling a micro light-emitting diode (LED) display, the method including: providing a plurality of inorganic light emitters and one or more pixel controllers; disposing the pixel controllers on a display substrate; micro transfer printing the plurality of inorganic light emitters onto the display substrate such that the plurality of inorganic light emitters are spatially separated on the display substrate in a light-emitter layer; electrically connecting the pixel controllers to the inorganic light emitters; and depositing a light-absorbing material on the display substrate in the light-emitter layer and surrounding at least a portion of the plurality of inorganic light emitters, thereby forming a light-absorbing layer on the display substrate.

In certain embodiments, the light-absorbing layer at least partially obscures at least a portion of the light-emitting areas of one or more inorganic light emitters and comprising forming optical vias in the light-absorbing layer.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 16A-16H are cross sections illustrating steps in constructing an embodiment of the present invention;

FIGS. 32A-32B are cross section views of another embodiment of the present invention.

Figure 1:
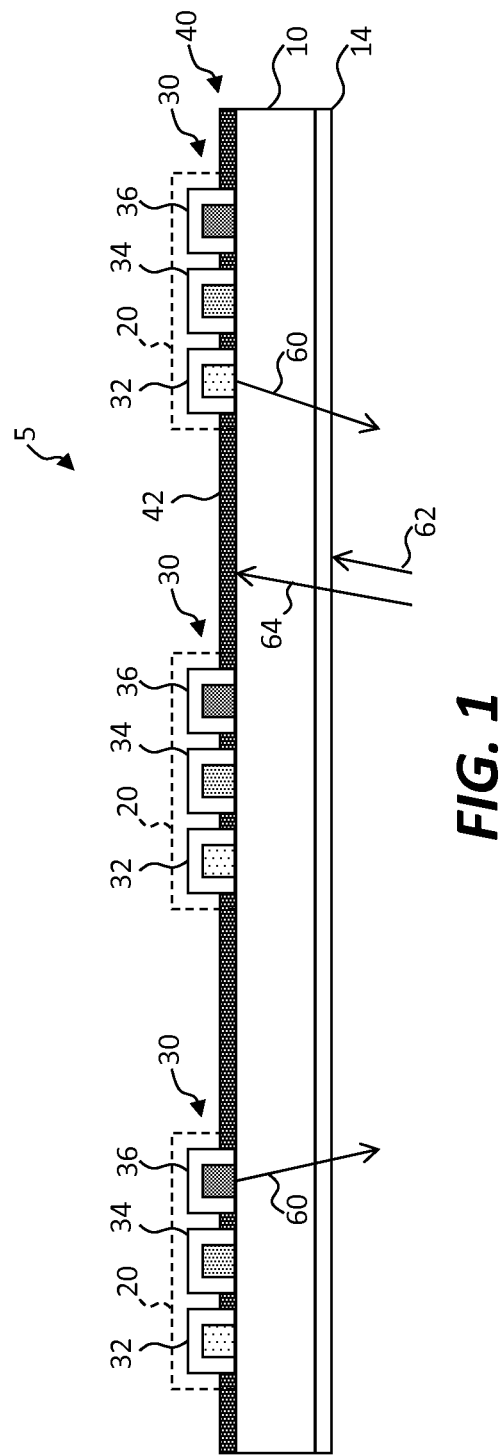
FIG. 1 is a cross section of an embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Figure 2A:
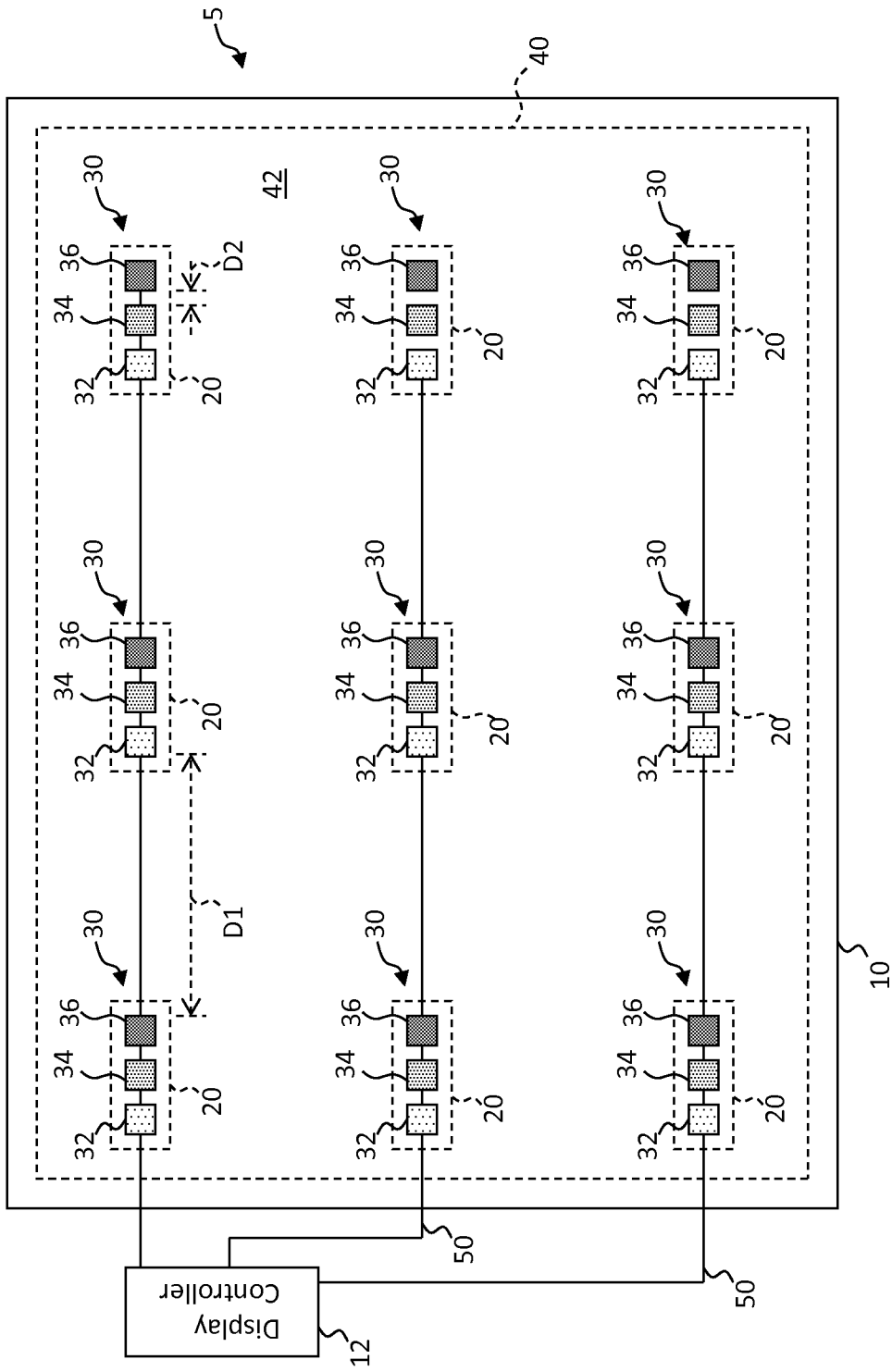
FIG. 2A is a plan view and FIG. 2B is a perspective of an embodiment of the present invention corresponding to the illustration of FIG. 1.
Figure 2B:
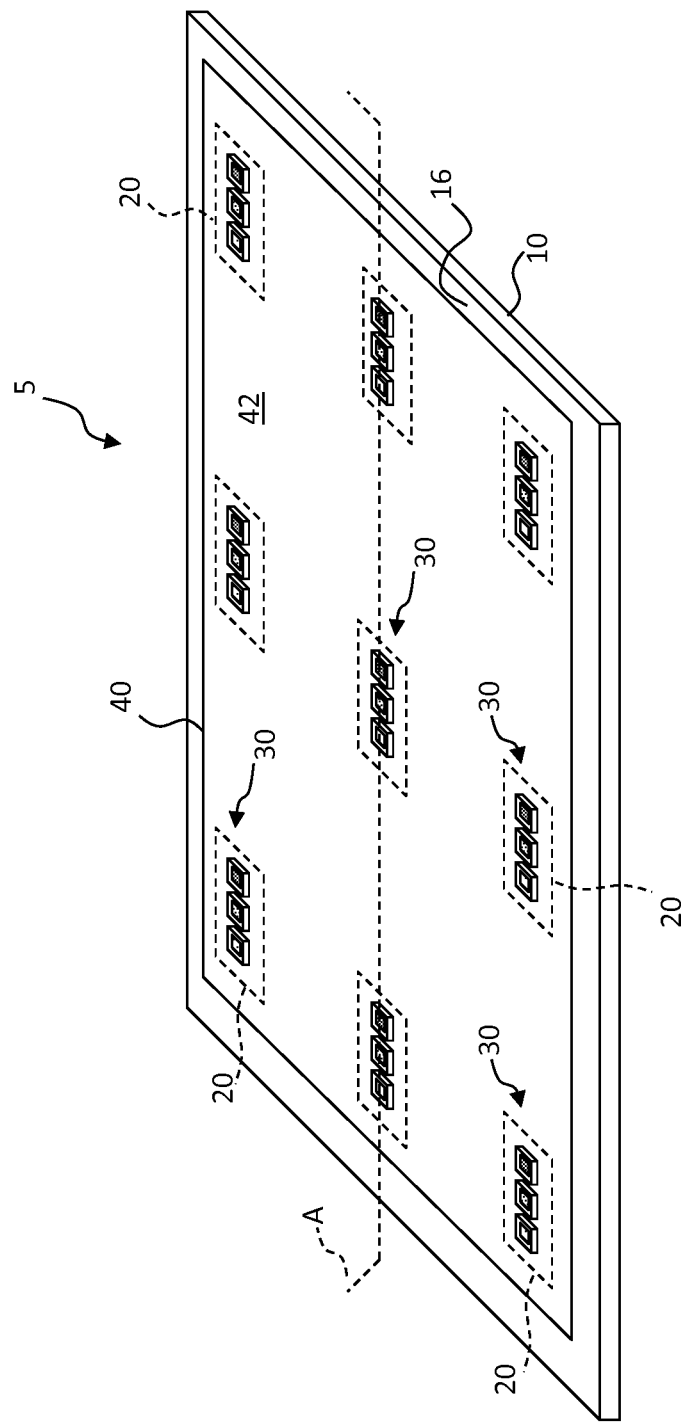

Referring to the cross section of FIG. 1, the plan view of FIG. 2A, and the perspective of FIG. 2B, where the FIG. 1 cross section is taken along the cross section line A of FIG. 2B, in an embodiment of the present invention an inorganic-light-emitter display 5 includes a display substrate 10. A plurality of spatially separated inorganic light emitters 30 are distributed over the display substrate 10 in a light-emitter layer 40. A light-absorbing material 42 is located over the display substrate 10 in the light-emitter layer 40 and in contact with the inorganic light emitters 30. The light-absorbing material 42 absorbs transmitted ambient light 64 transmitted through the display substrate 10 without interfering with emitted light 60. The light emitters 30 can emit different colors of light, for example red light emitters 32 that emit red light, green light emitters 34 that emit green light, and blue light emitters 36 that emit blue light arranged in a regular array of spatially separated pixel elements 20 that each include one of each color light emitter 30. In some embodiments, more or fewer light emitters are included in each pixel. For example, in addition to light emitters that emit red, green, and blue light, each pixel may include a light emitter than emits yellow light. In an embodiment, referring to FIG. 2A, the pixel elements 20 are spatially separated by a distance D1 that is greater than the distance D2 that separates the light emitters 30 included in a pixel element 20.

The light emitters 30 and the light-absorbing material 42 in the light-emitter layer 40 can be in contact with the display substrate 10 or provided in a layer over or under the display substrate 10. The display substrate 10 can be transparent, for example transmitting more than 50%, 80%, 90%, or 95% of visible light, and the light emitters 30 can emit light through the display substrate 10 to form a bottom-emitter display. Alternatively, the light emitters 30 can emit light in a direction opposite to the display substrate 10 to form a top-emitter display.

Figure 3A:
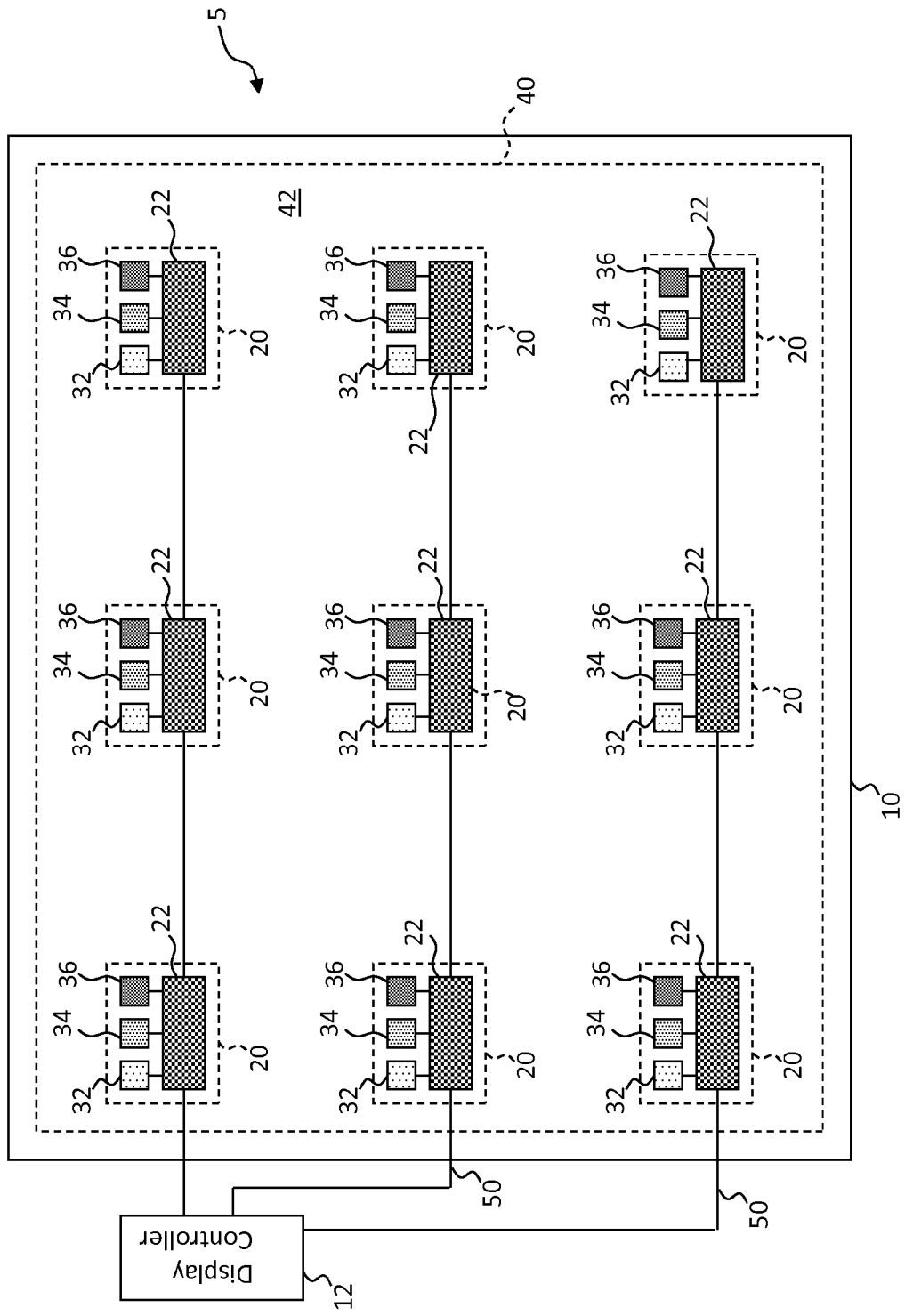
FIG. 3A is a plan view and FIG. 3B is a perspective of another embodiment of the present invention.
Figure 3B:
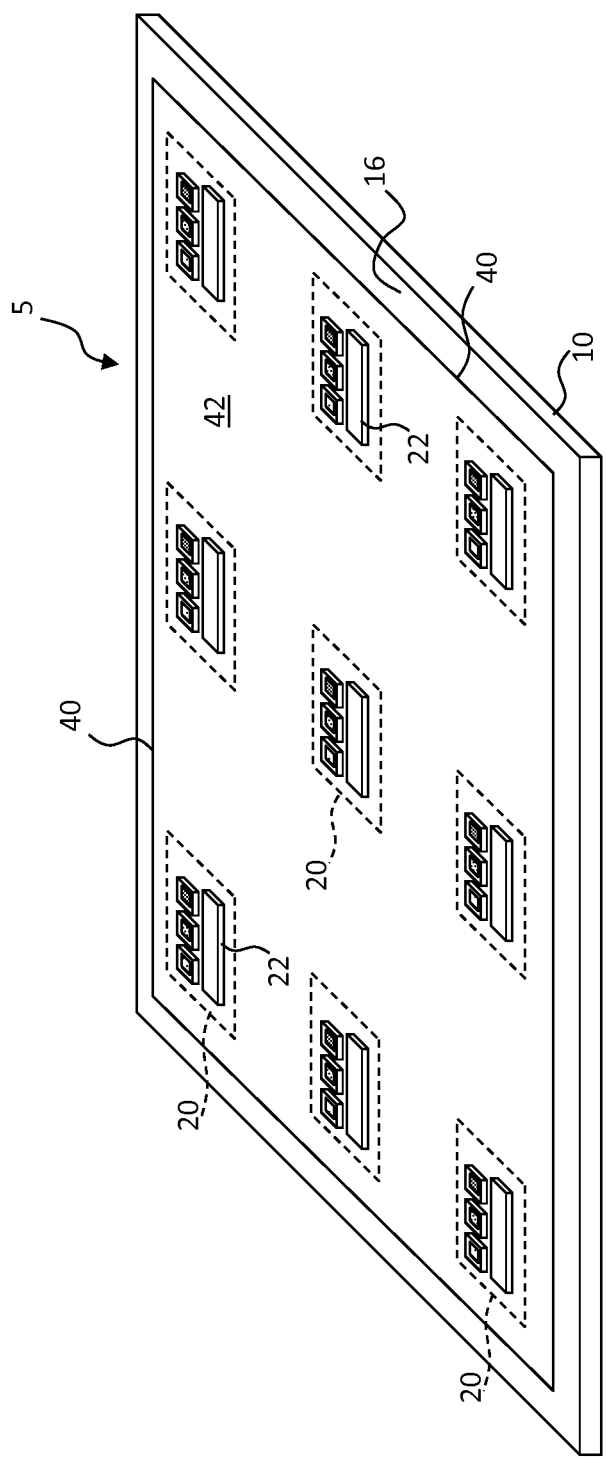

The light-emitter layer 40 includes light emitters 30 and the light-absorbing material 42. In one embodiment, the light emitters 30 and the light-absorbing material 42 are provided on a common surface or substrate, for example display substrate surface 16 on the display substrate 10. In another embodiment, portions of the light emitters 30 and portions of the light-absorbing material 42 are located in a plane parallel to, or are a common distance from, the display substrate 10. The light-emitter layer 40 can extend over the entire display substrate 10, as in FIG. 1, or extend over only a portion of the display substrate 10, as shown in FIGS. 2A and 2B. In an embodiment, the light-absorbing material 42 forms a contiguous surface, for example surrounding the light emitters 30. (For clarity of illustration, in FIGS. 2A and 2B, the light-emitter layer 40 is shown as an area and the light-absorbing material 42 is indicated as a surface on the display substrate 10 but is not shown as a dark layer as in FIG. 1. FIGS. 3A, 3B, and 6B use a similar illustrative convention.) The light-absorbing material can be located over the entire display substrate 10 or only a portion of the display substrate 10, for example a display area that includes only the spatial area encompassed by the light emitters 30.

In an embodiment, the light emitters 30 are formed in or located on the display substrate surface 16. For example, the light emitters 30 are located in a semiconductor layer formed over the extent of the display substrate 10, for example a layer of semi-crystalline polysilicon. In this embodiment, the components of the light emitters 30 are formed in the semiconductor layer and processed, for example using photolithographic processes, to form the light emitters 30. Such a structure has the advantage of using conventional photolithographic processes found in the integrated circuit and flat-panel display industries.

Alternatively, the light emitters 30 are formed in substrates or on supports separate from the display substrate 10. For example, the light emitters 30 in some embodiments are separately formed in a semiconductor wafer (e.g., light emitters emitting red light, green light, and blue light, in some embodiments, are each formed on a respective wafer). The light emitters 30 are then removed from the wafer and transferred, for example using micro transfer printing, to the display substrate 10. This arrangement has the advantage of using a crystalline silicon substrate that provides higher-performance integrated circuit components than can be made in the amorphous or polysilicon semiconductor available on a large substrate such as the display substrate 10. The display substrate 10, in some embodiments, is a polymer, plastic, resin, polyimide, PEN, PET, metal, metal foil, glass, a semiconductor, or sapphire. In this arrangement, the light emitters 30 are small inorganic light-emitting diodes or micro-LEDs. For a discussion of micro-transfer printing techniques see, U.S. Pat. Nos. 8,722,458, 7,622,367 and 8,506,867, each of which is hereby incorporated by reference.

In some embodiments, the light-absorbing material 42 in the light-emitting layer 40 is in contact with the inorganic light emitters 30, for example when the light-absorbing material 42 is in physical contact with the material that emits light, the substrate in which the light emitter 30 is formed, or a package encapsulating the light emitter 30. For example, an inorganic light-emitting diode light emitter 30 is in contact with the light-absorbing material 42 if the light-absorbing material 42 is in physical contact with a package encapsulating the LED or an LED substrate such as a semiconductor substrate.

As shown in FIG. 2A, the light emitters 30 are each electrically connected to one or more electrically conductive wires 50 that electrically connect two or more of the pixel elements 20 and conduct power, a ground reference voltage, or signals for controlling the pixel elements 20 and the light emitters 30. In an embodiment, the conductive wires 50 are connected to a display controller 12 that is external to the display substrate 10. In an alternative embodiment, not shown, the display controller 12 is located on the display substrate 10. The display controller 12 controls the inorganic-light-emitter display 5 by, for example, providing power, a ground reference signal, and control signals. For clarity of illustration, the conductive wires 50 and the display controller 12 are omitted from the perspective of FIG. 2B (and FIGS. 3B and 6A).

Figure 23:
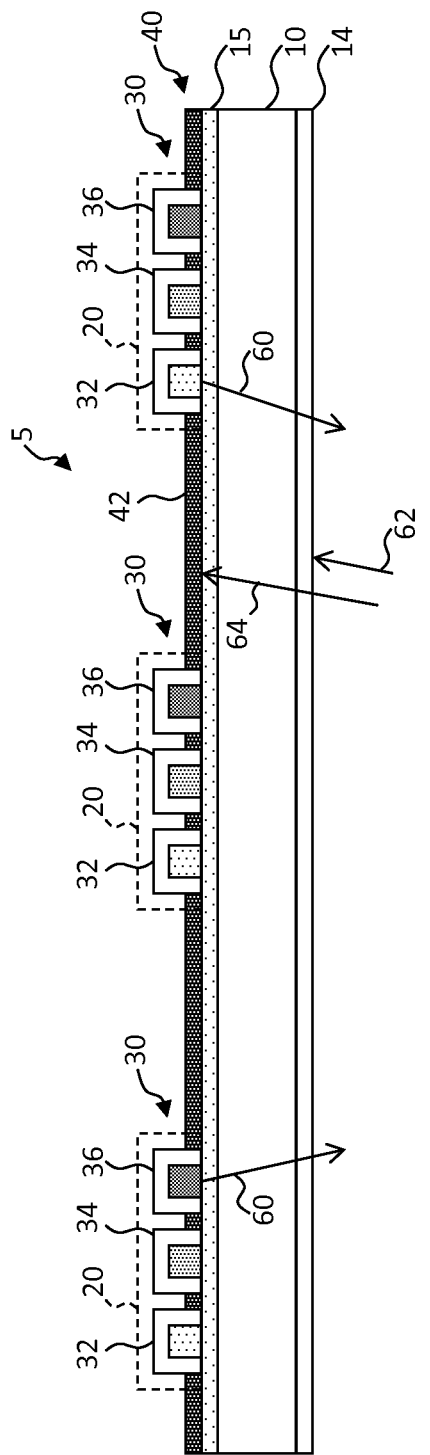

As illustrated in FIG. 23, in another embodiment of the present invention, a transparent adhesive layer 15 is located between the display substrate 10 and the plurality of spatially separated inorganic light emitters 30. The transparent adhesive layer 15 is transparent to visible light or the frequencies of light emitted by the inorganic light emitters 30 and can be 1-100 microns thick. The transparent adhesive layer 15 adheres the spatially separated inorganic light emitters 30 to the display substrate 10 and can maintain the position of the inorganic light emitters 30 during subsequent processing steps, such as coating the light-absorbing material 42. Suitable adhesives include optical clear adhesives (OCAs), polymers, or curable resins and can be optical-index matched to the display substrate 10 or to an element of the inorganic light emitters 30 (for example a protective or conductive layer over the light-emitting area of the inorganic light emitters 30). Index matching reduces reflections and enhances light output and resolution in a display. In a further embodiment, the transparent adhesive layer 15 has a thickness that causes constructive optical interference for one or more of the frequencies of light emitted by the inorganic light emitters 30 or that causes destructive optical interference for at least some frequencies of ambient light. Such a layer thickness can increase light output from the inorganic light emitters 30 and reduces ambient light reflections, thereby increasing the contrast of the device, as discussed with respect to FIG. 1.

Figure 29:
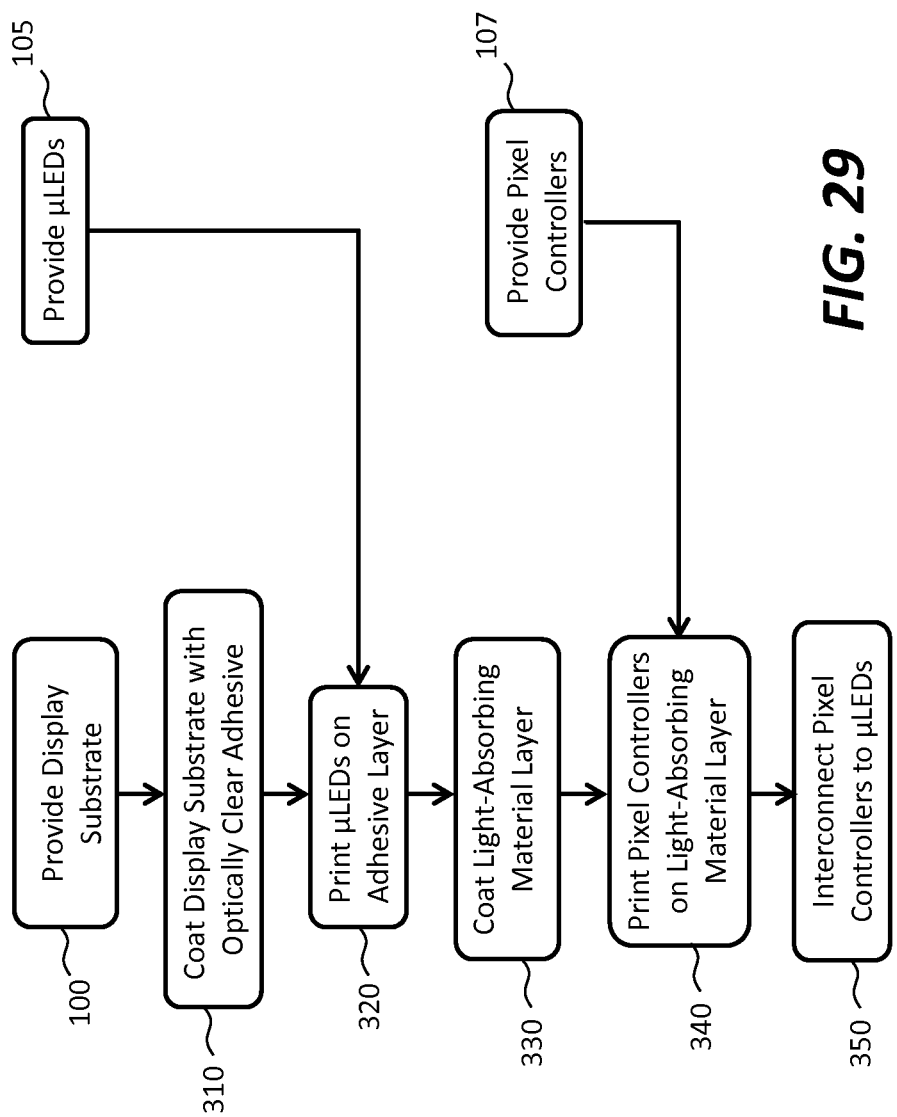
FIGS. 29-31 are flow charts illustrating methods of the present invention.

Referring to FIG. 29, according to the present invention a method of micro assembling a micro light-emitting diode (LED) display includes providing a plurality of inorganic light emitters 30 in step 105, providing one or more pixel controller in step 107, and a display substrate in step 100. In step 310, a transparent adhesive layer 15 is disposed on a display substrate 10, for example by coating a liquid or laminating an adhesive layer with or without a release layer and curing the adhesive. The plurality of inorganic light emitters 30 are micro transfer printed in step 320 onto the transparent adhesive layer 15 so that the plurality of inorganic light emitters 30 are spatially separated on the display substrate 10 in a light-emitter layer 40. In step 330, light-absorbing material 42 is deposited, for example by coating or laminating a layer of light-absorbing material 42, on the display substrate 10 in the light-emitter layer 40. The light-absorbing material 42 surrounds at least a portion of the plurality of inorganic light emitters 30 to form a light-absorbing layer on the display substrate 10.

Referring to the plan view of FIG. 3A and the perspective of FIG. 3B, in a further embodiment of the inorganic-light-emitter display 5 of the present invention, each pixel element 20 further includes a pixel controller 22. Each pixel controller 22 is electrically connected to the one or more light emitters 30 (for example the red light emitter 32, the green light emitter 34, and the blue light emitter 36) in each pixel element 20 and to the display controller 12 through the conductive wires 50 to control the light output of the one or more light emitters 30. As with the light emitters 30, the pixel controller 22 can be formed in a semiconductor layer on the display substrate 10 or on or in a separate substrate, such as a semiconductor substrate, and transferred to the display substrate 10, for example by micro transfer printing.

The pixel controller 22 can include power circuitry that is electrically connected to the light emitters 30. In another embodiment, the pixel controller 22 includes analog, digital, or mixed-signal circuitry. The pixel controller 22 can provide signals through the electrically conductive wires 50 to provide information to the display controller 12 and also can control the light emitters 30 to emit light in an image-wise fashion to provide a display, for example displaying images, graphics, text, or other information.

Figure 4:
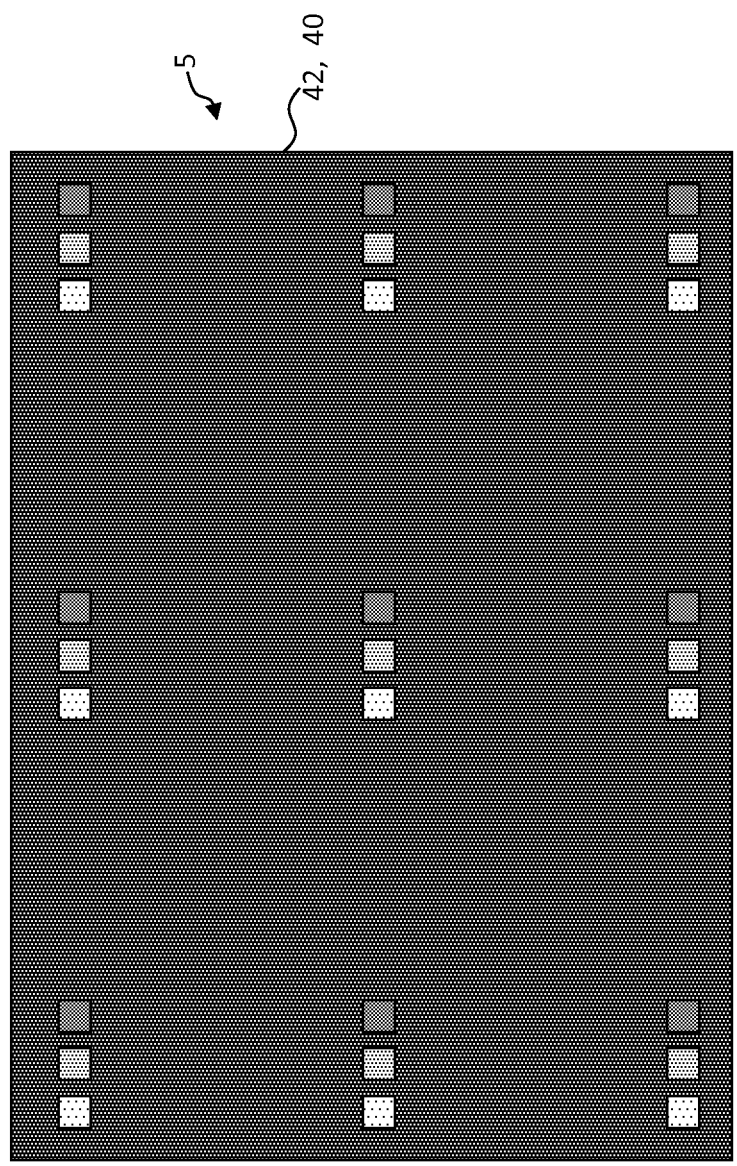
FIG. 4 is a plan view of an embodiment of the present invention.

FIG. 4 is a plan view of the top of the inorganic-light-emitter display 5 in the case of a top-emitter structure or is a plan view of the bottom of the organic-light-emitter display 5 in the case of a bottom-emitter structure. As shown, the three-color pixel elements 20 (emitting red, green, and blue light) are spatially separated over the display substrate 10 and surrounded and in contact with a contiguous layer of the light-absorbing material 42 on the display substrate 10. The light-absorbing material 42 absorbs transmitted ambient light 64 (FIG. 1) illuminating the inorganic-light-emitter display 5 from the emission (viewing) side of the display substrate 10.

Figure 24:
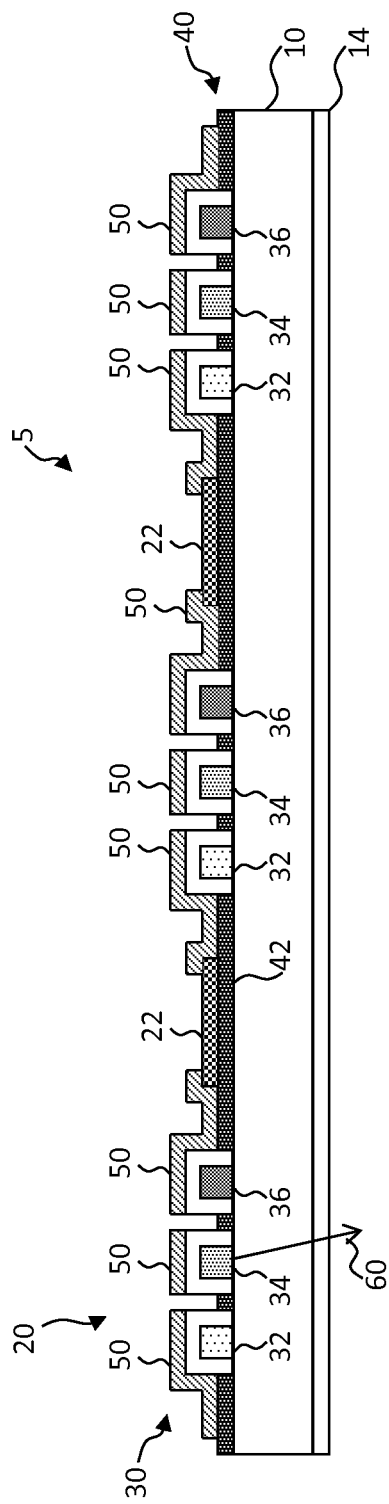

As shown in FIG. 24, in another embodiment of the present invention, the pixel controllers 22 can be located at least partially over the light-absorbing material 42 and electrically connected to the inorganic light emitters 30 with electrical connections, for example with conductive wires 50 including conductive metals. Metal or metal oxide electrical interconnections can be formed using photolithographic methods and materials. By locating the pixel controllers 22 and conductive wires 50 over the light-absorbing material 42, ambient light reflections from the pixel controllers 22 and conductive wires 50 are reduced, improving the contrast of the display. Therefore, referring again to FIG. 29, in a further embodiment of the present invention, one or more pixel controllers 22 are disposed on the light-absorbing material 42 in step 340 and electrically connected to one or more of the inorganic light emitters 30 in step 350.

Figure 5:
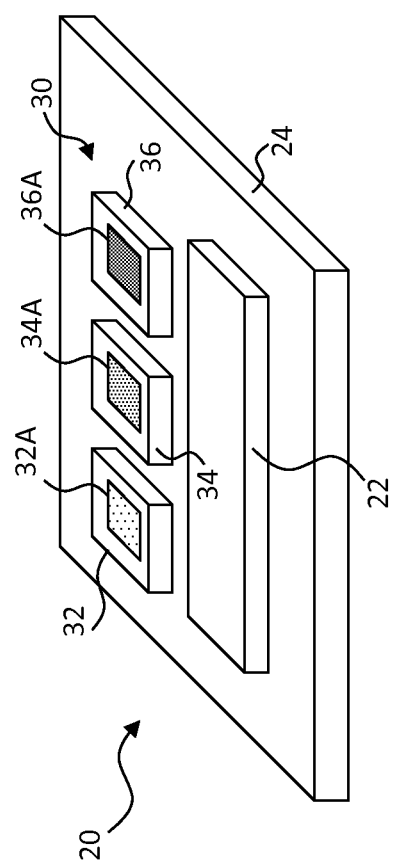
FIG. 5 is a perspective of a pixel element useful in an embodiment of the present invention.
Figure 6A:
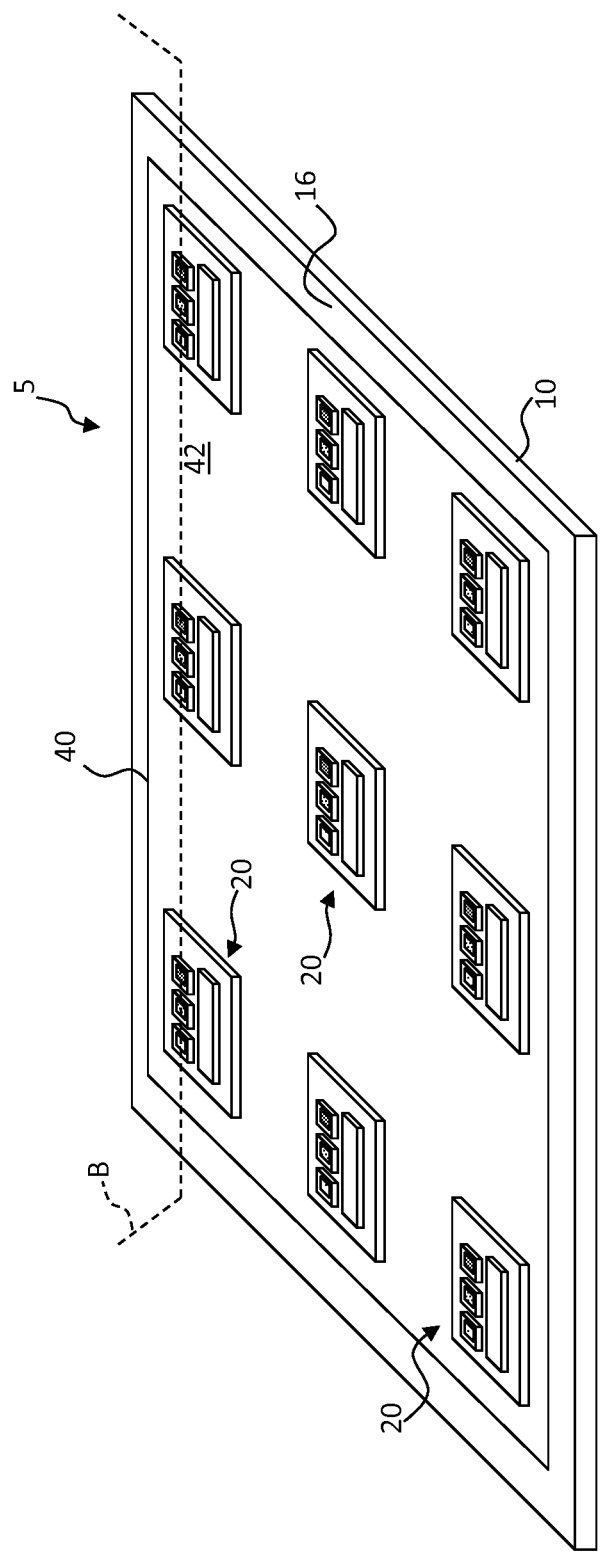
FIG. 6A is a perspective view and FIG. 6B is a cross section of yet another embodiment of the present invention including the pixel element illustrated in FIG. 5.
Figure 6B:
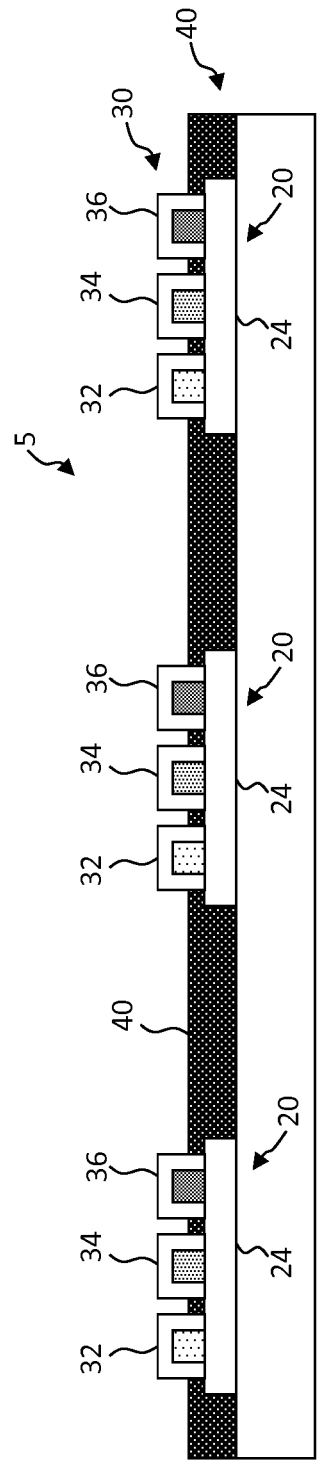

Referring next to the perspective of FIG. 5, the perspective of FIG. 6A, and the cross section of FIG. 6B taken along the cross section line B of FIG. 6A, in an alternative embodiment the light emitters 30 and the pixel controller 22 are located on or in a pixel substrate 24 smaller than and separate and distinct from the display substrate 10. In such an embodiment the display substrate 10 can include material, for example glass or plastic, different from a material in the pixel substrate 24, for example a semiconductor material such as silicon. In some embodiments, the display substrate 10 and pixel substrate 24 are formed of the same material. In some embodiments, the pixel substrate is glass, plastic, metal, or other such materials (e.g., material non-native to the light emitters). In any of these cases, a pixel substrate 24 that is separate and distinct from the display substrate 10 and that is processed independently from the display substrate 10 to form light emitters 30 is non-native to the display substrate 10. Likewise, the light emitters 30 formed on or in the pixel substrate 24 are non-native to the display substrate 10. A further discussion of utilizing pixel substrates in a display can be found in U.S. Patent Application Ser. No. 62/055,472 filed Sep. 25, 2014, entitled Compound Micro-Assembly Strategies and Devices, the contents of which are incorporated by reference herein in its entirety.

In one embodiment, the pixel substrate 24 is a semiconductor or includes semiconductor materials and the pixel elements 20 or the pixel controller 22 are formed in the pixel substrate 24, for example using conventional photolithographic and integrated circuit processing techniques, and the pixel substrate 24 is separately located on the display substrate 10. Alternatively, as shown in FIGS. 5, 6A, and 6B, the pixel elements 20 and the pixel controller 22 are formed in separate substrates that are located on the pixel substrate 24 and the pixel substrate 24 is separately located on the display substrate 10. In such an embodiment, the pixel controller 22 or the light emitters 30 can be formed separately on separate semiconductor substrates, assembled onto the pixel substrate 24, and then the assembled unit (including the pixel substrate 24, the light emitters 30 and the pixel controller 22) is located on the display substrate surface 16. This arrangement has the advantage that the pixel elements 20 can be separately tested before they are located on the display substrate surface 16, thus improving yields and reducing costs.

As shown in FIG. 5, the light emitters 30 each have a light-emissive area, e.g. red-light-emissive area 32A, green-light-emissive area 34A, and blue-light-emissive area 36A. The light-emissive area of each light emitter 30 can be only a portion of the light emitter 30. The combined light-emissive area is then the sum of the red-light-emissive area 32A, green-light-emissive area 34A, and blue-light-emissive area 36A. In various embodiments, the combined light-emissive areas of the light emitters 30 is less than or equal to one eighth, one tenth, one twentieth, one fiftieth, one hundredth, one two-hundredth, one five-hundredth, one thousandth, one ten thousandth of the area of the light-absorbing material 42 or the area of the light-emitter layer 40.

In an embodiment of the present invention, the light emitters 30 are micro-light-emitting diodes (micro-LEDs), for example having light-emissive areas of less than 10, 20, 50, or 100 square microns. For example, light emitters 30 can have a height, length, and/or width from 2 to 5 µm, 4 to 10 µm, 10 to 20 µm, or 20 to 50 µm. Such micro-LEDs have the advantage of a small light-emissive area compared to their brightness as well as color purity providing highly saturated display colors and a substantially Lambertian emission providing a wide viewing angle for the inorganic-light-emitter display 5 of the present invention. A discussion of micro-LEDs and micro-LED displays can be found in U.S. patent application Ser. No. 14/743,981, filed Jun. 18, 2015, entitled Micro Assembled Micro LED Displays and Lighting Elements, which is hereby incorporated by reference in its entirety.

Figure 7:
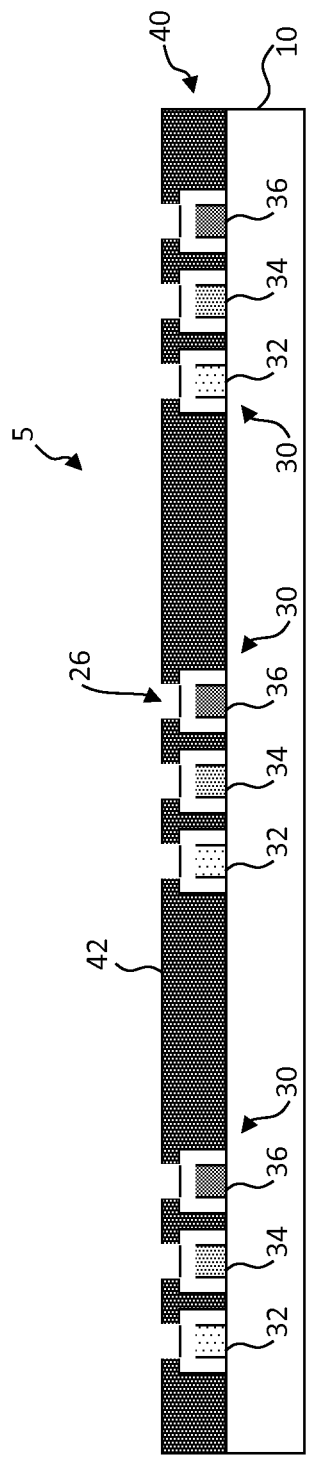
FIG. 7 is a cross section of another embodiment of the present invention.

Referring to FIG. 7, in an embodiment of the inorganic-light-emitter display 5, the light emitters 30 are at least partially between the light-absorbing material 42 and the display substrate 10. As shown in FIG. 7, the red, green, and blue light emitters 32, 34, 36 are located on the display substrate 10 and the light-absorbing material 42 in the light-emitter layer 40 extends at least partially over the light emitters 30. Vias 26 are formed in the light-absorbing material 42 where the light-absorbing material 42 overlaps the light emitters 30 to provide electrical connections to the light emitters 30 for example to the conductive wires 50 (not shown in FIG. 7).

Figure 9:
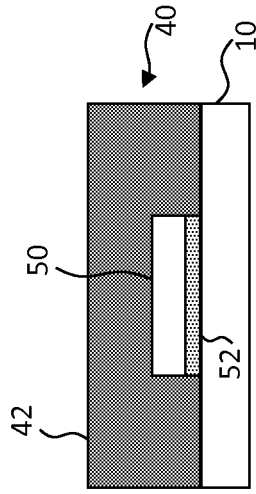
FIGS. 8, 9, and 10 are cross sections of various conductive wire structures in accordance with embodiments of the present invention.
Figure 10:
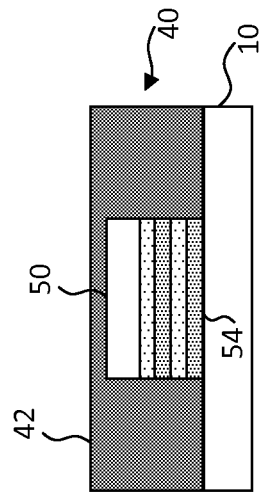
Figure 8:
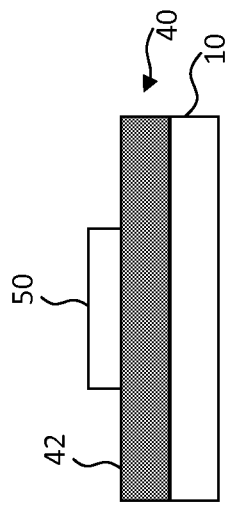

The electrically conductive wires 50 electrically connect the light emitters 30 to each other and to sources of power, ground reference voltage, or signals, for example from the display controller 12. In an embodiment, and as shown in FIG. 8, the electrically conductive wires 50 are located or formed on the light-absorbing material 42 over the light-emitter layer 40. In an alternative embodiment, and as shown in FIGS. 9 and 10, the electrically conductive wires 50 are located or formed under the light-absorbing material 42 in the light-emitter layer 40 and on or over the display substrate 10. In this arrangement, to avoid reflecting transmitted ambient light 64 from the conductive wires 50, a light filter is located between the conductive wires 50 and the display substrate 10. The light filter can be an additional light absorber 52 such as a black metal, carbon, carbon black, a black metal, or chromium dioxide or other metal oxides for example as shown in FIG. 9, or a dichroic filter 54 as shown in FIG. 10.

In a further embodiment of the present invention, the light-absorbing material 42 includes multiple layers of light-absorbing material 42 and the conductive wires 50 are located between the layers. For example, a first layer of light-absorbing material 42 is formed, then the conductive wires 50 are formed on the first layer of light-absorbing material 42, and then a second layer of light-absorbing material 42 is formed over the first layer and the conductive wires 50. By placing the conductive wires 50 between the layers of light-absorbing material 42, the conductive wires 50 are rendered less reflective and less visible, reducing the reflectance of the display and improving the display's contrast.

The inorganic-light-emitter display 5 of the present invention can be operated in a variety of useful ways. In one way, the display controller 12 provides power, a ground reference, and control signals to the pixel elements 20 through the electrically conductive wires 50. The signals can provide a passive-matrix control of the light emitters 30 in the pixel elements. In an alternative embodiment, the pixel elements 20 include the pixel controller 22. The display controller 12 is connected to the pixel controller 22 through the conductive wires 50 and provides control signals for operating the light emitters 30. In response to control signals from the display controller 12, the pixel controllers 22 each control the light emitters 30, for example in an active-matrix control configuration. Referring again, to FIG. 1, in a bottom-emitter embodiment, the light emitters 30 emit light 60 through the display substrate 10 to display information with the inorganic-light-emitter display 5. An anti-reflection layer 14 or coating absorbs or transmits most, but not all, of the incident ambient light 62 incident on the inorganic-light-emitter display 5. Transmitted ambient light 64 is absorbed by the light-absorbing material 42. Although some of the transmitted ambient light 64 can be reflected from the light emitters 30, the aperture ratio of the inorganic-light-emitter display 5 is so small (for example much less than 1%), that reflected transmitted ambient light 64 is negligible, providing the inorganic-light-emitter display 5 with an excellent contrast ratio, even in bright conditions. Furthermore, a color filter (not shown) can be employed with the light-emitters 30 emitting light of the corresponding color to further absorb ambient light. In the top-emitter case, the anti-reflection layer 14 is located on a display cover opposite the display substrate 10 and the ambient light, incident from the top side of the inorganic-light-emitter display 5, is absorbed in a similar way.

Figure 11:
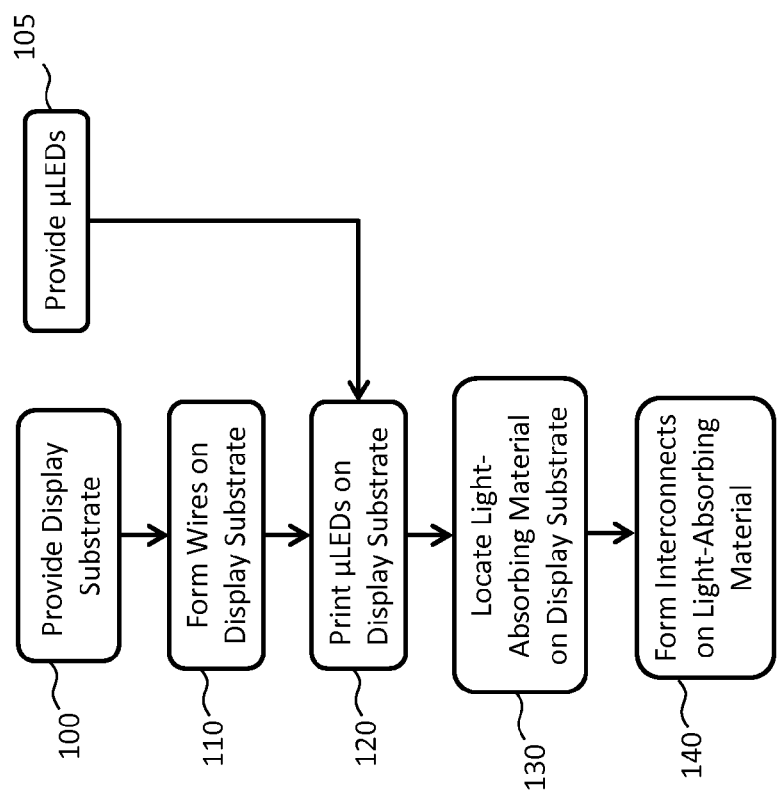

Referring to FIGS. 1 and 11, in a method of the present invention, the display substrate 10 is provided in step 100. The display substrate 10 can be any conventional substrate such as glass, plastic, or metal or include such materials. The display substrate 10 can be transparent, for example having a transmissivity greater than or equal to 50%, 80%, 90%, or 95% for visible light. The display substrate 10 has two opposing smooth sides (such as the display substrate surface 16) suitable for material deposition, photolithographic processing, or micro-transfer printing of micro-LEDs. The display substrate 10 can have a size of a conventional display, for example a rectangle with a diagonal length of a few centimeters to one or more meters and a thickness of 50 microns to 10 mm or even more. Such substrates are commercially available. Before, after, or at the same time the light emitters 30 (e.g. micro-LEDs) are provided in step 105, using conventional photolithographic integrated-circuit processes on semiconductor substrates. The micro-LED semiconductor substrates are much smaller than and separate and distinct from the display substrate 10 and can include different materials. In an alternative method, the controller and micro-LEDs are made in a semiconductor coating formed on the display substrate 10 using conventional substrate processing methods, for example employing low- or high-temperature polysilicon processed, for example with excimer lasers, to form localized crystalline silicon crystals (e.g. LTPS). Likewise, the display controller 12 is made using photolithographic integrated circuit processes on semiconductor substrates, using analog, digital, or mixed-signal circuits.

In step 110 the conductive wires 50 are formed on the display substrate 10 using photolithographic and display substrate processing techniques, for example photolithographic processes employing metal or metal oxide deposition using evaporation or sputtering, curable resin coatings (e.g. SU8), positive or negative photo-resist coating, radiation (e.g. ultraviolet radiation) exposure through a patterned mask, and etching methods to form patterned metal structures, vias, insulating layers, and electrical interconnections. The conductive wires 50 can include light-absorbing layers. Inkjet and screen-printing deposition processes and materials can be used to form the patterned conductive wires 50 or other electrical elements.

In an embodiment, the light emitters 30 (e.g. micro-LEDs) formed in step 105 are transfer printed to the display substrate 10 in step 120 in one or more transfers. As mentioned above, micro-transfer methods are described in U.S. Pat. Nos. 8,722,458, 7,622,367 and 8,506,867, each of which is hereby incorporated by reference. The light-absorbing material 42 is then deposited in step 130, for example by coating (e.g. by spin, curtain, or hopper coating) over the display substrate 10 and in contact with the light emitters 30. The light-absorbing material can include a polymer, resin, acrylic, or curable resin, for example with cross-linking materials and can include light-absorbing particles, pigments, or dyes, for example carbon black, or black metal particles such as chromium dioxide or other metal oxides. If the light-absorbing material 42 includes a curable resin, when cured the resin can adhere the light emitters 30 to the display substrate 10. In an embodiment and as shown in FIG. 7, the light-absorbing material 42 can cover a portion or all of one or more of the light emitters 30. In an embodiment, the light-absorbing material 42 is patterned, for example using photolithographic patterning methods such as photographically defining or imaging the light-absorbing material 42 and then developing the material. In an alternative technique, the light-absorbing material 42 is not photo-patterned but, since it can be coated after the light elements 30 are located on the display substrate 10 and is therefore formed contiguously around and in contact with the light emitters 30, the light-absorbing material 42 is patterned without resorting to additional processing steps.

The transferred light emitters 30 are then interconnected in step 140 at least partly on the light-absorbing materials 42 using similar materials and methods as in step 110, for example with the conductive wires 50 and optionally including connection pads and other electrical connection structures, to enable the display controller 12 to electrically interact with the light emitters 30 to emit light in the inorganic-light-emitter display 5. In alternative processes, the transfer or construction of the light emitters 30 is done before or after all of the conductive wires 50 are in place. Thus, in embodiments the construction of the conductive wires 50 can be done before the light emitters 30 are printed (in step 110 and omitting step 140) or after the light emitters 30 are printed (in step 140 and omitting step 110), or using both steps 110 and 140. In any of these cases, the light emitters 30 are electrically connected with the conductive wires 50, for example through connection pads on the top or bottom of the light emitters 30. Thus, the light emitters 30 can be completely electrically connected before the light-absorbing materials 42 is deposited or after.

In an embodiment, the display controller 12 is externally located (for example on a separate printed circuit board substrate) and electrically connected to the conductive wires 50 using conventional connectors, ribbon cables, or the like. Alternatively, the display controller 12 is affixed to the display substrate 10 outside the area of the light-emitter layer 40 and electrically connected to the conductive wires 50 using conventional wires and buses (not shown), for example using surface mount and soldering technology.

Figure 12:
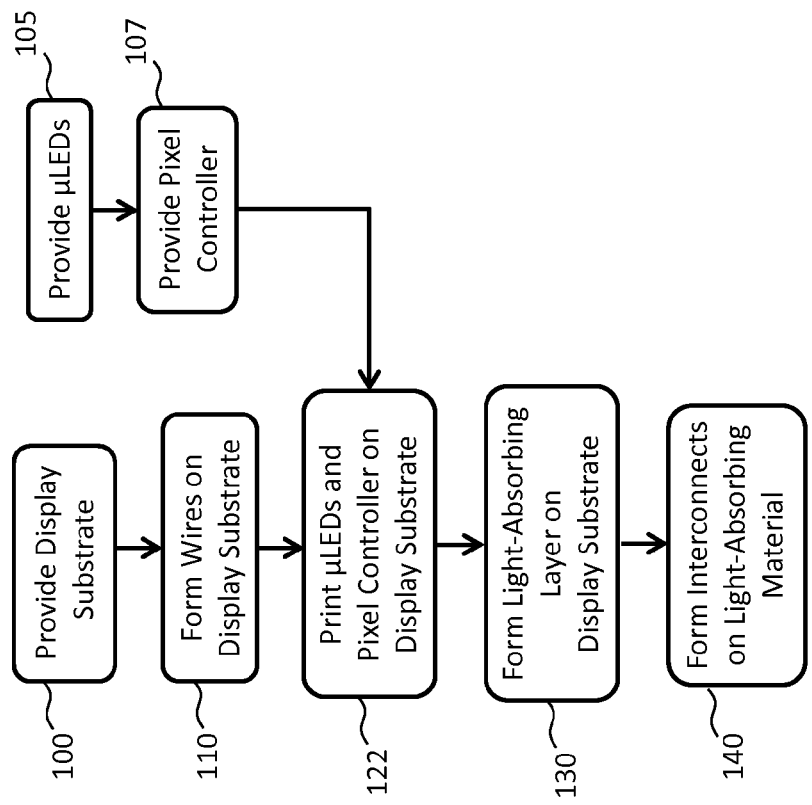
FIGS. 11-13 are flow charts illustrating methods of the present invention.

Referring to FIG. 12, in an alternative process and referring also to FIGS. 3A and 3B, the pixel controller 22 is provided in step 107, for example using conventional semiconductor integrated circuit processes, in addition to providing the display substrate 10 (in step 100) and providing the light emitters 30 (in step 105). The pixel controller 22 can be provided at the same time as, before, or after the micro-LEDs, on separate semiconductor wafers, or on the same semiconductor wafer. In step 122, the light emitters 30 and the pixel controller 22 are transfer printed to the display substrate 10, either in a common transfer step or separate transfer steps from the same or different semiconductor wafers. The remaining steps 100, 110, 130, and 140 of FIG. 12 are the same as those described with respect to FIG. 11.

Figure 13:
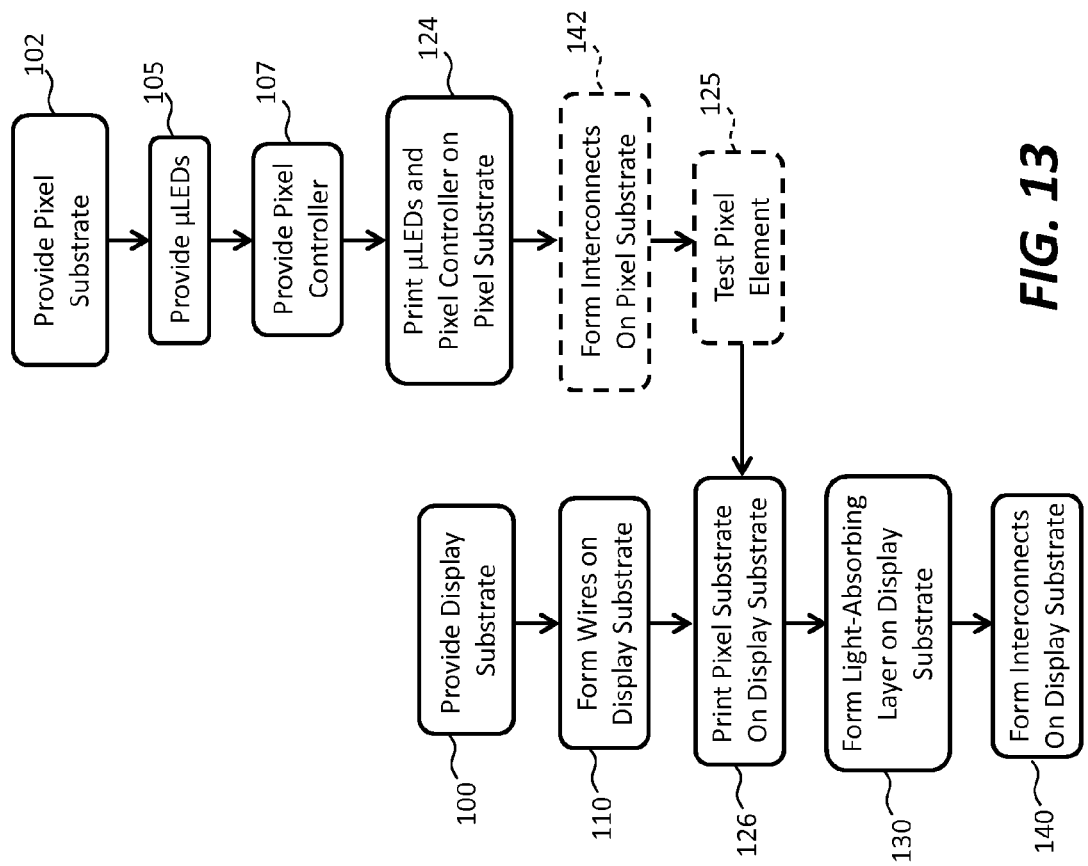

Referring next to FIG. 13, in yet another process and referring also to FIGS. 5, 6A and 6B, the pixel substrate 24 is provided in step 102 in addition to providing the display substrate 10 (in step 100), providing the light emitters 30 (in step 105), and providing the pixel controller 22 (in step 107). The pixel substrate 24 can, for example, be similar to the display substrate 10 (e.g. made of glass or plastic) but in a much smaller size, for example having an area of 50 square microns, 100 square microns, 500 square microns, or 1 square mm and can be only a few microns thick, for example 5 microns, 10 microns, 20 microns, or 50 microns. The light emitters 30 (e.g. micro-LEDs) and the pixel controller 22 are transfer printed onto the pixel substrate 24 in step 124 using one or more transfers from one or more semiconductor wafers to form the pixel element 20 with the pixel substrate 24 separate from the display substrate 10, the substrate of the pixel controller 22, and the substrates of the light emitters 30. In an alternative embodiment, not shown, the pixel substrate 24 includes a semiconductor and the light emitters 30 and the pixel controller 22 and, optionally, some electrical interconnections, are formed in the pixel substrate 24. In optional step 142, electrical interconnects are formed on the pixel substrate 24 to electrically interconnect the light emitters 30 and the pixel controller 22, for example using the same processes that are employed in steps 110 or 140. In optional step 125, the pixel elements 20 on the pixel substrates 24 are tested and accepted, repaired, or discarded. In step 126, the pixel elements 20 are transfer printed or otherwise assembled onto the display substrate 10 and then electrically interconnected in step 140 with the conductive wires 50 and to connection pads for connection to the display controller 12. The steps 102 to 107 can be done in any order and before or after any of the steps 100 or 110.

By employing the multi-step transfer or assembly process of FIG. 13, increased yields are achieved and thus reduced costs for the inorganic-light-emitter display 5 of the present invention. A further discussion of the multi-step transfer or assembly process can be found in U.S. Patent Application Ser. No. 62/055,472 filed Sep. 25, 2014, entitled Compound Micro-Assembly Strategies and Devices.

Figure 14:
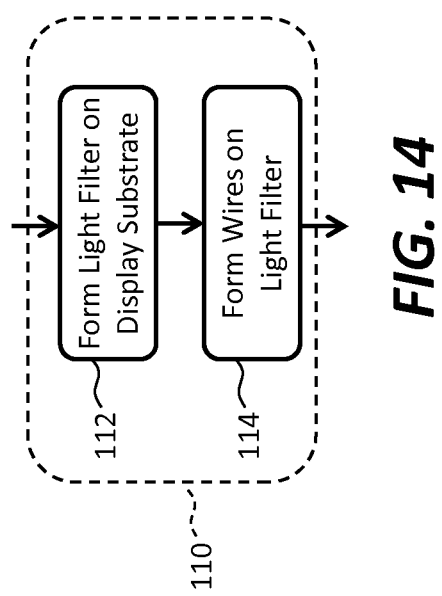
FIG. 14 is a flow chart of a method in accordance with an embodiment of the present invention.

Referring to FIG. 14, the step 110 of forming the conductive wires 50 on the display substrate 10 can include forming a light filter (for example the light absorber 52 or the dichroic filter 54, as shown in FIGS. 9 and 10) and then constructing the conductive wires 50 over or on the light filter to reduce ambient light reflection from the conductive wires 50. The conductive wires 50 can be made using various techniques, such as, for example, photolithographic processes.

Figure 15:
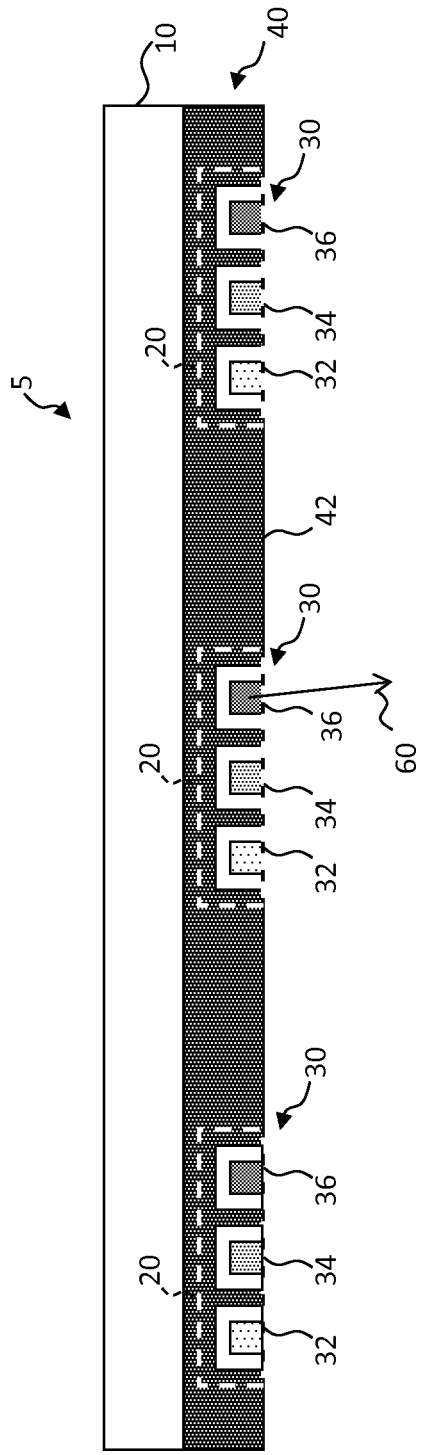
FIG. 15 is a cross section of an embodiment of the present invention.

Referring next to FIG. 15, in an alternative embodiment of the present invention, the display substrate 10 is located on an opposite side of the light-emitter layer 40 with respect to the direction of light 60 emission and not through the display substrate 10. In this embodiment, the display substrate 10 can be adhered directly to the light-absorbing material 42 or an additional adhesive layer (not shown) is located between the display substrate 10 and the light-absorbing material 42 to adhere them together. The pixel elements 20 having light emitters 30 including red, green, and blue light-emitters 32, 34, 36 are as described above with respect to FIG. 1. The embodiment of FIG. 15 has the advantage that a very thin display substrate 10 can be employed. For example, in various embodiments the display substrate 10 is thin glass, a polymer, plastic, resin, polyimide, PEN, PET, metal, metal foil, a semiconductor, or sapphire. Alternatively or in addition, the display substrate 10 is flexible. In some embodiments, the display substrate 10 has a thickness less than or equal to 500 microns, 200 microns, 100 microns, 50 microns, 10 microns, or 5 microns.

Figure 16A:
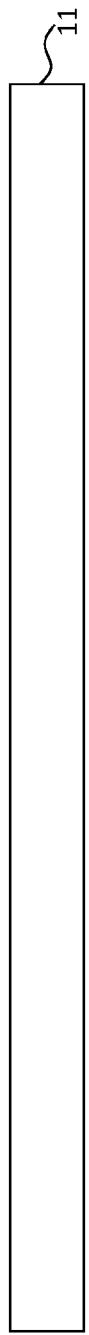
Figure 16B:
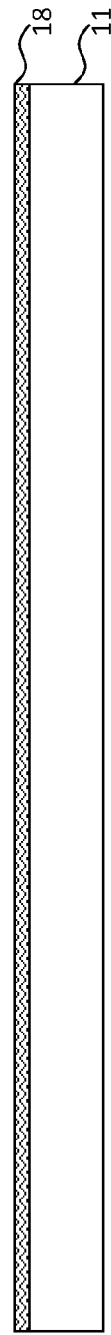
Figure 16C:
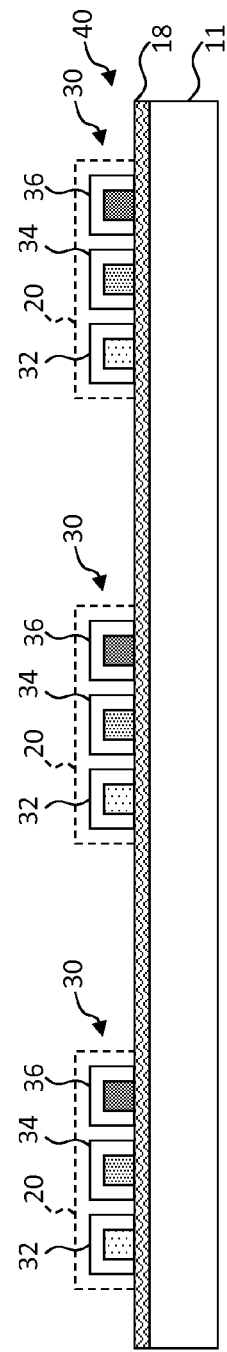
Figure 16D:
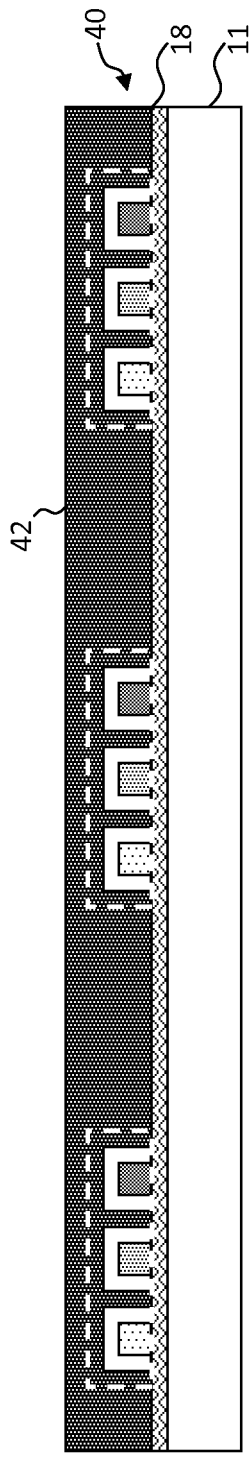
Figure 19:
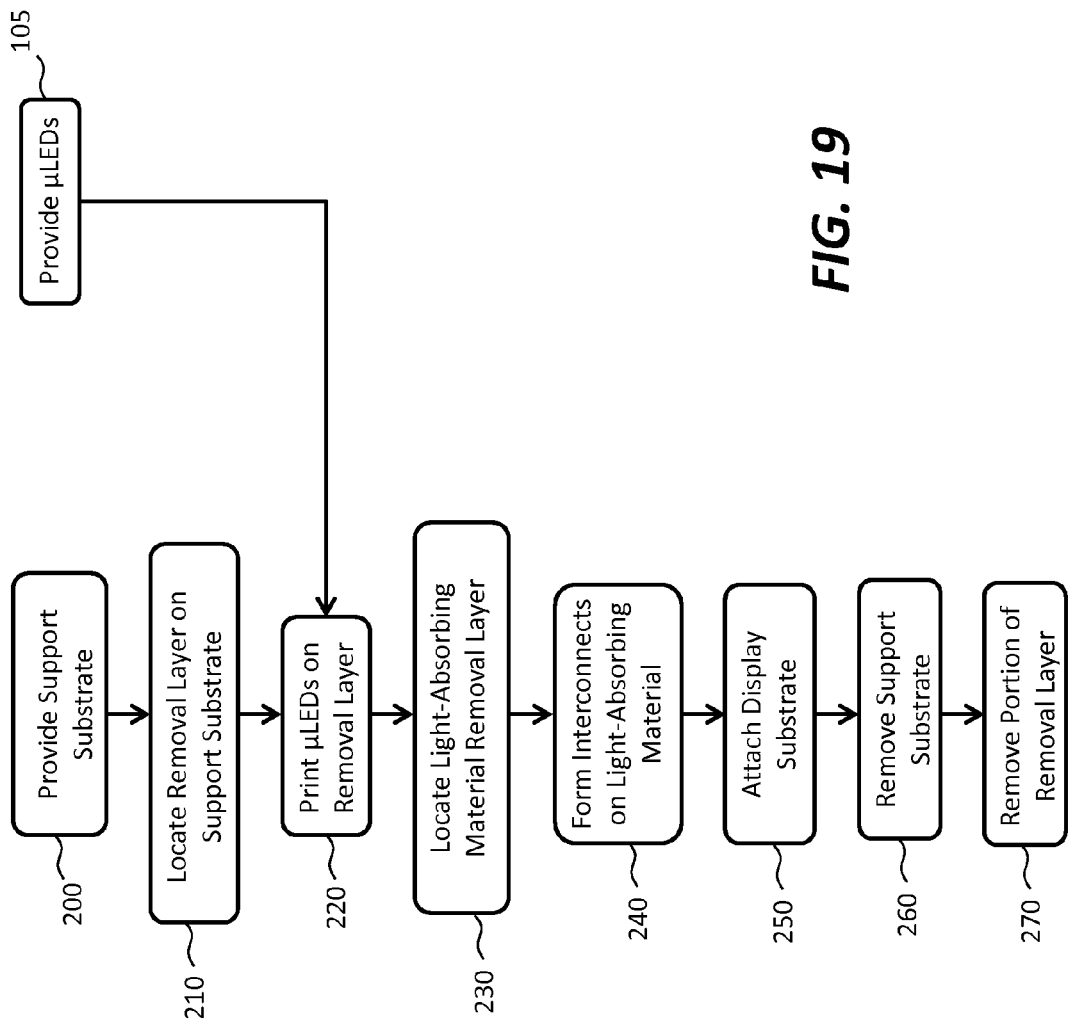
FIG. 19-21 are flow charts illustrating methods of the present invention.

As shown in FIGS. 16A-16H and in FIG. 19, the embodiment illustrated in FIG. 15 is constructed by providing a support substrate 11 in step 200 and as shown in FIG. 16A. The support substrate 11 can be any substrate with a supporting surface suitable for coating, printing, or processing and can be, for example, glass or plastic. The support substrate 11 is coated in step 210 with a removal layer 18, for example comprising a removable adhesive or ablation material, as illustrated in FIG. 16B. Referring next to FIG. 16C, the red, green, and blue light emitters 32, 34, 36 making up the pixel elements 20 are located on the removal layer 18 on the support substrate 11, for example by micro transfer printing as discussed above, in step 220. As shown in FIG. 16D, in step 230 light-absorbing material 42 is provided over the light-emitters 30, the removal layer 18 and support substrate 11, for example by curtain coating, spin coating, or hopper coating a liquid light-absorbing material over the removal layer 18 and then at least partially drying or curing the liquid light-absorbing material to form the light-absorbing material 42. In step 240 (not shown) electrical interconnects are patterned over the light-absorbing material 42 to electrically interconnect the red, green, and blue light emitters 32, 34, 36, for example using photolithographic processes and materials such as metal. In an alternative method, the interconnection step 240 is done before the light-absorbing material 42 is provided or between layers of the light-absorbing material 42.

Figure 16E:
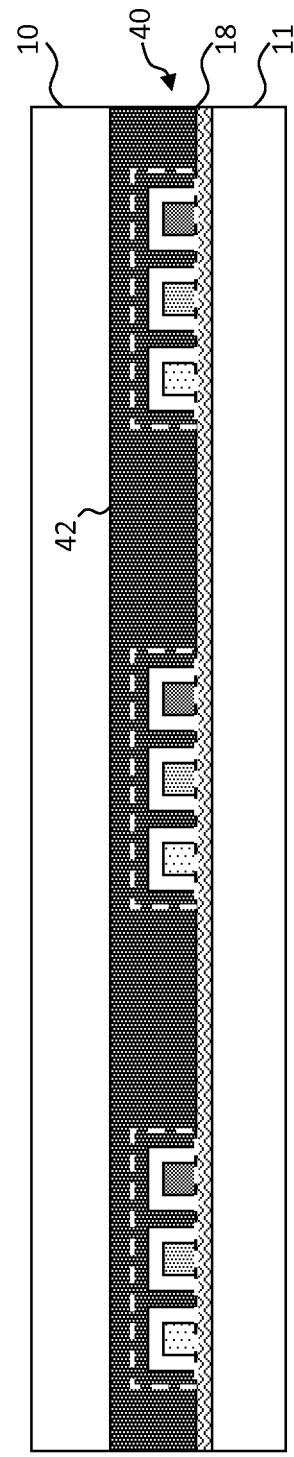

Referring to FIG. 16E, in step 250 the display substrate 10 is attached to the light-absorbing material 42 or to any layers formed on the light-absorbing material 42. For example, an adhesive layer (not shown) can be provided on the light-absorbing material 42 to adhere the light-absorbing material 42 to the display substrate 10. Alternatively, the light-absorbing material 42 can be adhesive, in a cured, partially cured, or uncured state, and directly adheres the display substrate 10 to the light-absorbing material 42.

Figure 16F:
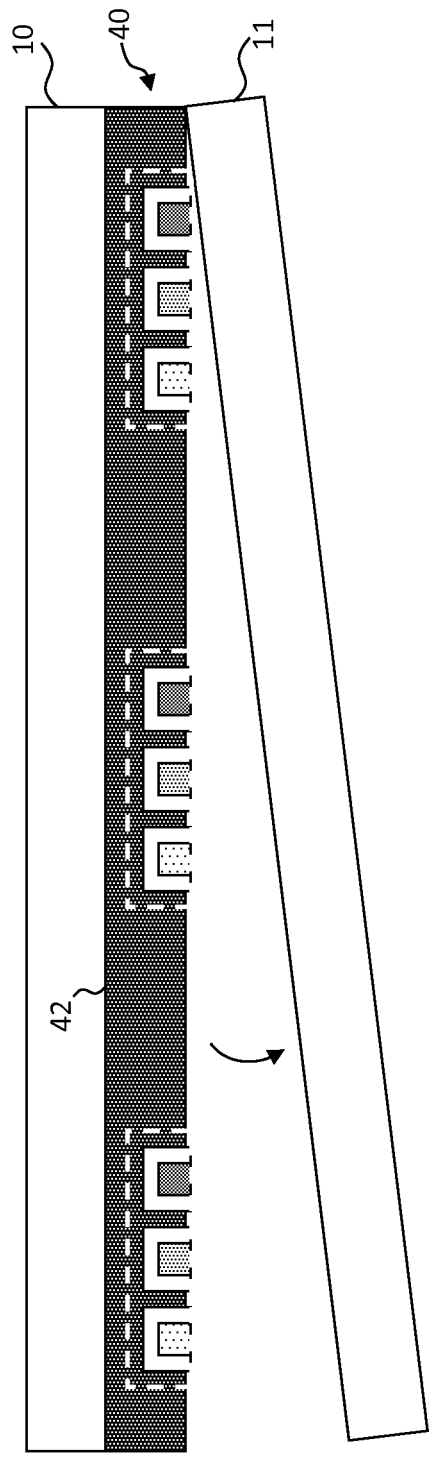
Figure 16G:
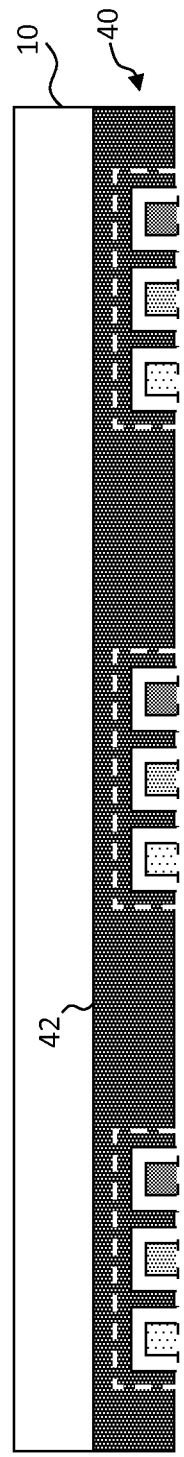

In step 260 and as shown in FIG. 16F, the support substrate 11 is removed, for example by mechanically peeling the support substrate 11 from the light-absorbing material 42 and light emitters 30, or by grinding, etching, or polishing. After the support substrate 11 is removed in step 260, the structure illustrated in FIG. 16G (similar to that of FIG. 15 and reproduced here for clarity) is made. In another embodiment, the removal layer 18 serves as an ablation layer. In such an embodiment the removal layer 18 absorbs light emitted from a light source, for example a laser, is ablated, and releases the light-emitting layer 40 from the support substrate 11.

Figure 20:
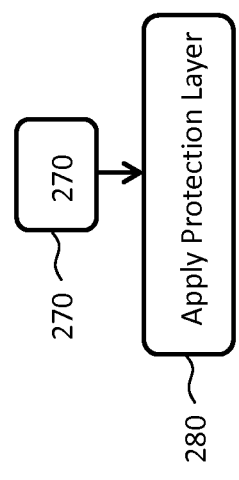
Figure 21:
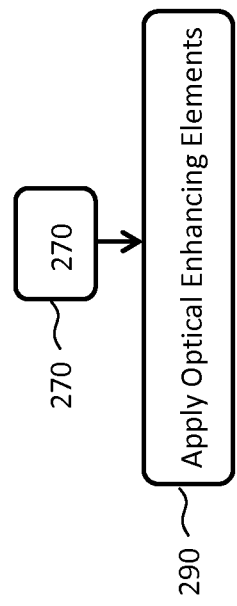

A protective layer 19 can be applied, for example by adhesion or coating, to the light-absorbing material 42 and light emitters 30, in step 280 and as shown in FIG. 16H and FIG. 20. Suitable protective materials can include resins, plastics, scratch-resistant glass, diamond-like coatings, optical hard coats, and the like that are substantially transparent to the light emitted from the light emitters 30. Alternatively or in addition, optical enhancing elements can be added in step 290 (FIG. 21). Such elements can include dichroic coatings, anti-reflection coatings, refractive elements such as lenslets, or diffractive elements.

Figure 17:
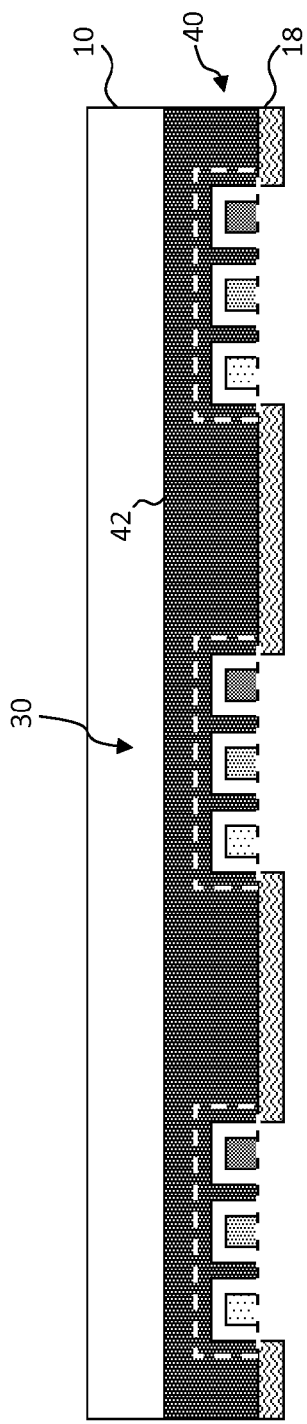
FIG. 17 is a cross section of an embodiment of the present invention including a patterned removal layer.

In an embodiment of the present invention, the removal layer 18 is at least partially removed with the support substrate 11 in step 270 and as shown in FIGS. 17 and 19. In the embodiment illustrated in FIG. 17, the removal layer 18 is patterned, for example to expose the light emitters 30 and can itself be light absorbing, further improving the contrast of the display.

Figure 18:
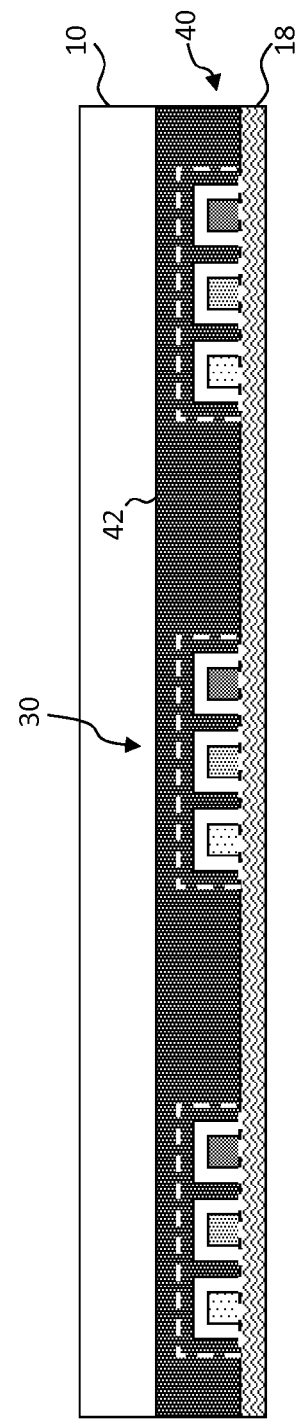
FIG. 18 is a cross section of yet another embodiment of the present invention including a transparent removal layer.

In another, different embodiment the removal layer 18 remains with the light-absorbing material 42 and the light emitters 30 in the light-emitting layer 40 as shown in FIG. 18. In this embodiment, the material making up the removal layer 18 can be transparent to the light emitted by the light emitters 30. The embodiment of the present invention illustrated in FIG. 15 enables a very thin display substrate 10, since the construction of the light-emitting layer 40 is done on a temporary support substrate 11 that is subsequently removed from the display structure. This construction process and structure enables ultra-thin, flexible, direct-view, efficient emissive displays that have extremely low reflectivity and are made in a simple and robust process.

Figure 22:
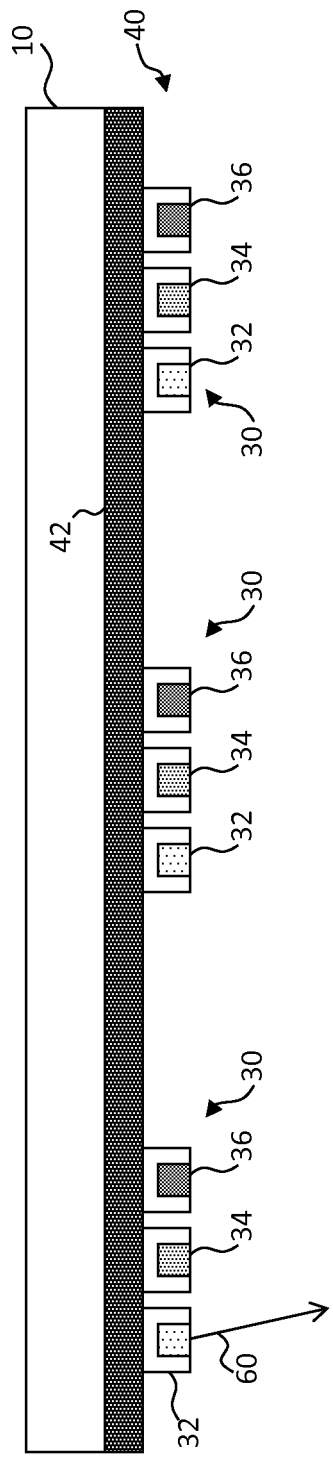
FIGS. 22-28 are cross sections of various embodiments of the present invention.

Referring next to FIG. 22, in an alternative embodiment of the present invention, the display substrate 10 is located on an opposite side of the light-emitter layer 40 with respect to the direction of light 60 emission. In this embodiment, the display substrate 10 can be adhered directly to the light-absorbing material 42 or an additional adhesive layer (not shown) is located between the display substrate 10 and the light-absorbing material 42 to adhere them together. The pixel elements 20 having light emitters 30 including red, green, and blue light-emitters 32, 34, 36 are as described above with respect to FIG. 1. In some embodiments, such as the embodiment shown in FIG. 22, the light emitters 30 are transferred (e.g., micro-transfer printed) to the light-absorbing material 42 from the native substrate(s) of the light emitters 30. Since light is not emitted through the substrate 10 but rather in a direction opposite the display substrate 10, this embodiment is a top-emitter embodiment.

Figure 25:
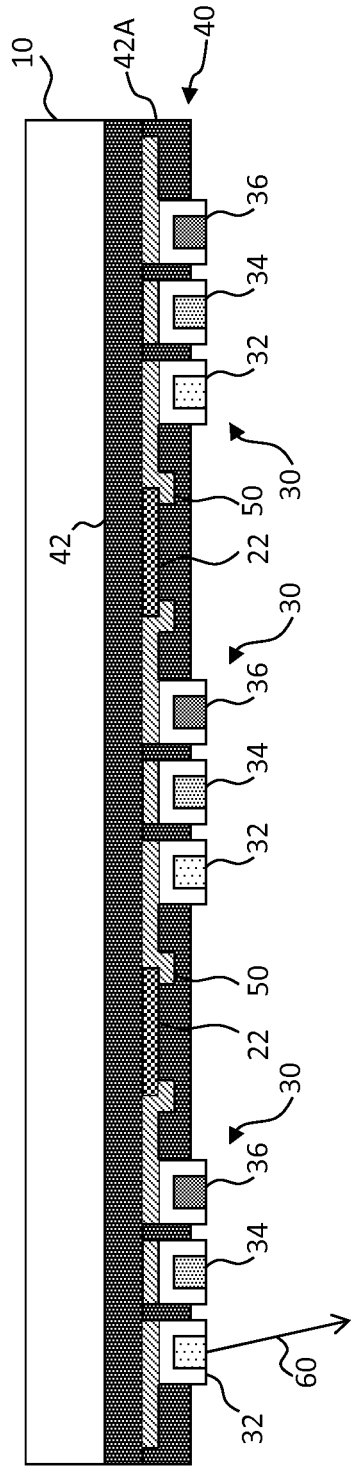

As shown in FIG. 25, in a further top-emitter embodiment of the present invention, one or more pixel controllers 22 are electrically connected to the inorganic light emitters 30 with conductive wires 50 on the side of the light-absorbing material 42 opposite the display substrate 10. The light-absorbing material 42 forms a first layer and a second layer of light-absorbing material 42A is disposed on the first layer, the pixel controllers 22, and the conductive wires 50. By locating the pixel controllers 22 and conductive wires 50 between the light-absorbing material 42 and the display substrate 10, ambient light reflections from the pixel controllers 22 and conductive wires 50 are reduced, improving the contrast of the display.

Figure 26:
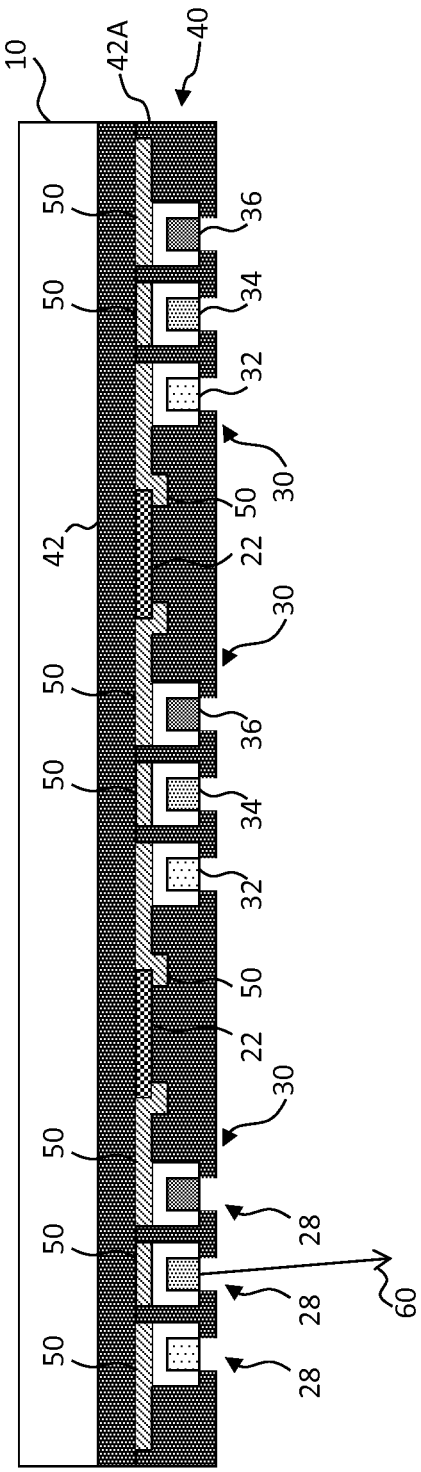

The second layer of light-absorbing material 42A can be coated. In one embodiment, the relative surface energy of the light-absorbing material 42A and the inorganic light emitters 30 is such that the second layer of light-absorbing material 42A does not coat the light-emitting area of the inorganic light emitters 30. In another embodiment, the second layer of light-absorbing material 42A is coated over the inorganic light emitters 30 and the second layer of light-absorbing material 42A is subsequently etched to expose the light-emitting area of the inorganic light emitters 30. This etch can reduce the entire thickness of the second layer of light-absorbing material 42A, for example as shown in FIG. 25. Alternatively, as shown in FIG. 26, the second layer of light-absorbing material 42A is removed from the light-emitting areas of the inorganic light emitters 30 or from the inorganic light emitters 30, forming optical vias 28 located at least partially in correspondence with the light-emitting areas of the inorganic light emitters through which light is emitted from the light-emitting areas of the inorganic light emitters 30.

Figure 30:
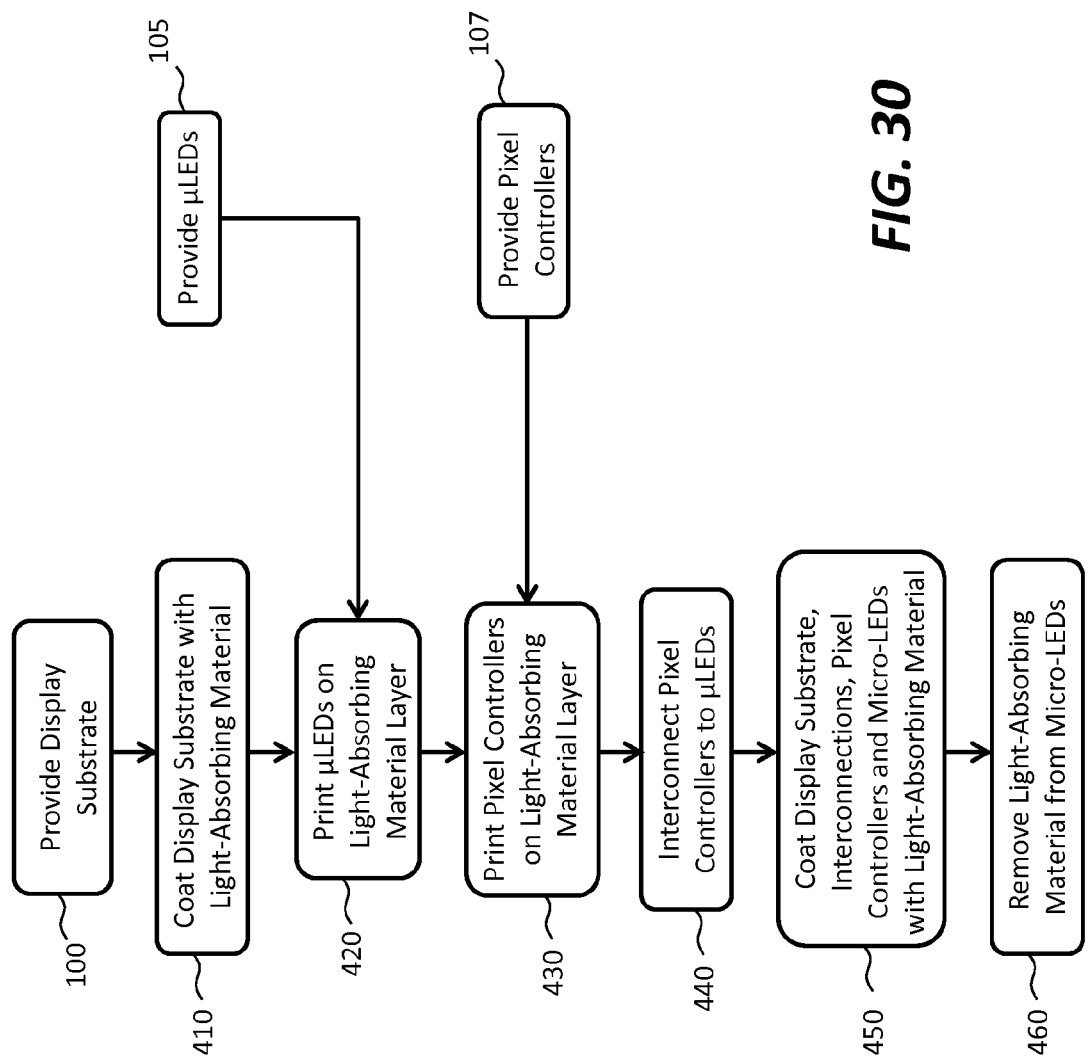

Referring next to FIG. 30, in a corresponding method of the present invention light emitters 30 such as micro-LEDs are provided in step 105, pixel controllers 22 in step 107, a display substrate 10 is provided in step 100, and a light-absorbing material 42 layer is disposed on the display substrate 10 in step 410, for example by coating or laminating with or without a release layer. Light emitters 30, such as micro-LEDs, are disposed on the light-absorbing material 42, for example by micro transfer printing, in step 420, as well as pixel controllers 22 in step 430. The pixel controllers 22 are electrically connected to the light emitters 30 in step 440, for example by photolithographically defined metal conductive wires 50. The light-absorbing material 42 forms a first layer and a second layer of light-absorbing material 42 is disposed on the first layer at least partially between the inorganic light emitters 30 and at least partially over the pixel controllers and electrical connections in step 450. The light-absorbing material 42 of the second layer can at least partially obscure or occlude the light-emitting areas of the one or more inorganic light emitters 30. If any light-absorbing material occludes the light-emitting areas of the light emitters 30, it is removed in step 460, for example by etching optical vias 28 over the light-emitting areas of the light emitters 30 in the second layer.

The second layer of light-absorbing material 42 can include curable materials (for example including ultra-violet-sensitive cross-linking materials or heat-sensitive curable materials). In such an embodiment, in a further method of the present invention, the curable material is cured except where it is exposed, for example by a laser. An image of the light emitters 30 or the light-emitting areas of the light emitters 30 is made before the second layer is disposed over the light emitters 30 and the locations of the light emitters 30 or the light-emitting areas of the light emitters 30 are extracted from the image by image processing. After the second layer of light-absorbing material 42 is disposed over the light emitters 30, the locations are exposed to light, for example laser light. The curable second layer is then developed and the light-emitting areas of the light emitters 30 are exposed.

Figure 27:
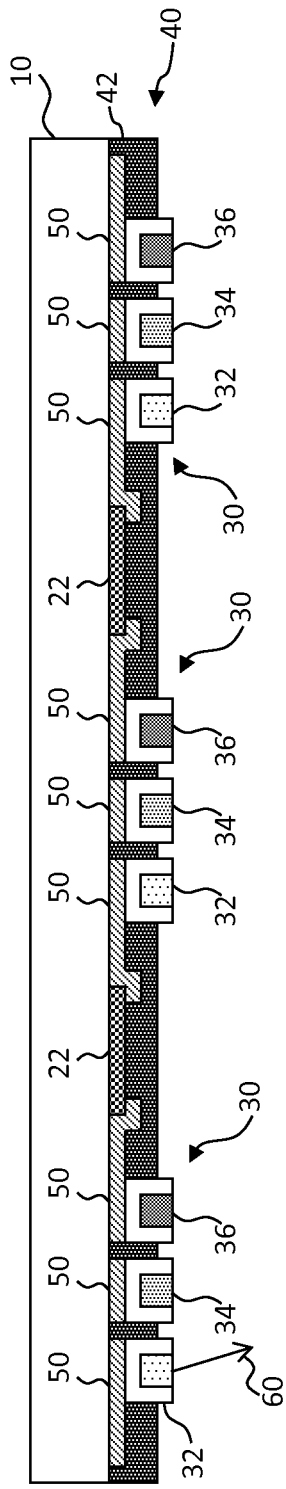
Figure 28:
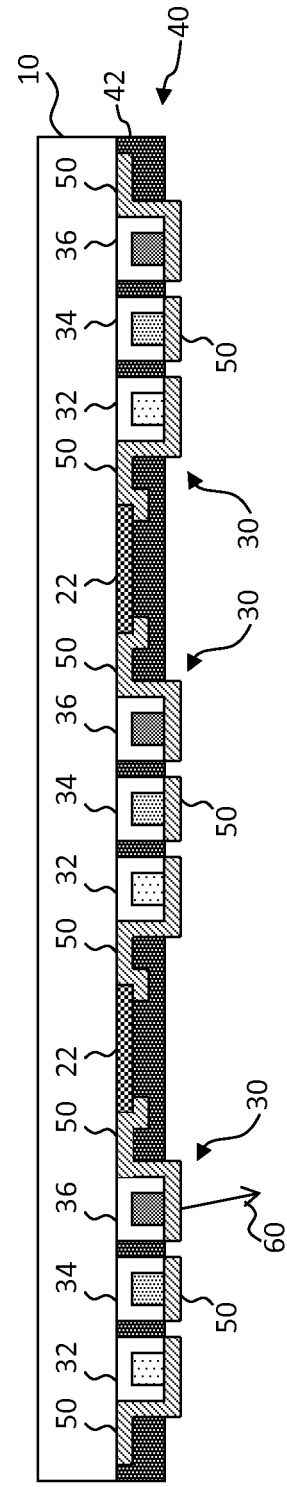

Alternative top-emitter embodiments are illustrated in FIG. 27 and FIG. 28. As shown in both FIGS. 27 and 28, one or more pixel controllers 22 are disposed on the display substrate 10. In FIG. 27, electrical connections such as conductive wires 50 are also formed on the display substrate 10. The inorganic light emitters 30 are disposed over and electrically connected to the conductive wires 50. The light-absorbing material 42 is disposed over the pixel controllers 22 and the conductive wires 50 and can be coated or patterned, for example as described with respect to the second layer of light-absorbing material 42A shown in FIG. 25 so that the pixel controllers 22 and the electrical connections 50 are located at least partially between the light-absorbing material 42 and the display substrate 10. As shown in FIG. 28, some of the conductive wires 50 are formed over the inorganic light emitters 30. In these embodiments, optical vias can be formed in the light-absorbing material 42 as described with respect to the second layer of light-absorbing material 42A shown in FIG. 26. This arrangement is useful for inorganic light emitters 30 that emit light through an electrode or have a vertical electrode structure. The structures of FIGS. 27 and 28 are similar to that of FIG. 26 except that only a single layer of light-absorbing material 42 is needed, thus reducing the amount of required materials and the number of processing steps.

Figure 31:
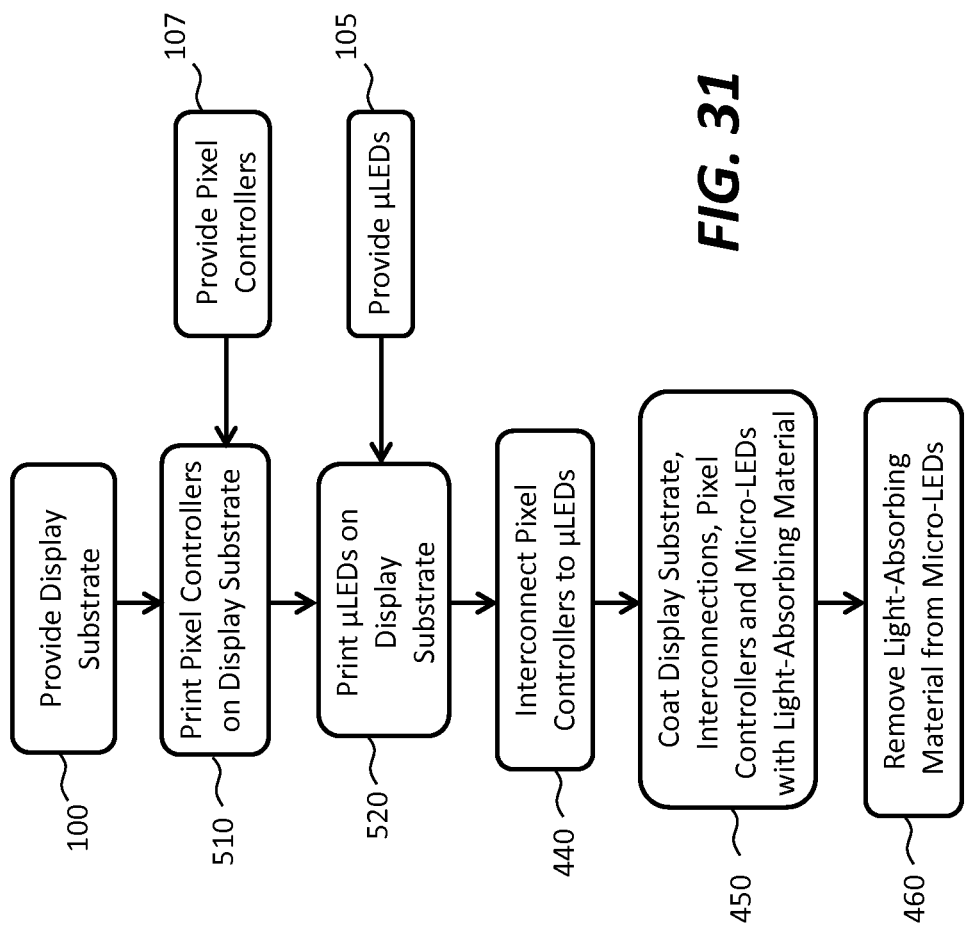

Referring next to FIG. 31, in a corresponding method of the present invention light emitters 30 such as micro-LEDs are provided in step 105, pixel controllers 22 in step 107, and a display substrate 10 is provided in step 100. Pixel controllers 22 are disposed on the display substrate 10, for example by micro transfer printing, in step 510, and the light emitters 30, such as micro-LEDs, are disposed on the display substrate 10, for example by micro transfer printing, in step 520. The pixel controllers 22 are electrically connected to the light emitters 30 in step 520, for example by photolithographically defined metal conductive wires 50. Note that the steps 510 and 520 can be interchanged in other embodiments. For example, the conductive wires 50 can be formed on the display substrate 10 before the light emitters 30 are located on the display substrate 10 (as shown in FIG. 27) or the light emitters 30 are disposed on the display substrate 10 before the conductive wires 50 are formed on the display substrate 10 (as shown in FIG. 28). In the former case, the light emitters 30 are at least partly disposed over the conductive wires 50 (as shown). Similarly, the conductive wires 50 can be made on the display substrate 10 before the pixel controllers 22 are located on the display substrate 10. Thus, steps 510, 520, and 440 can be performed in various orders depending on the desired structure. Alternatively, conductive wires 50 are formed both before and after the light emitters 30 are disposed on the display substrate 10.

Once the light emitters 30 are connected to the pixel controllers 22, a layer of light-absorbing material 42 is disposed over the light emitters 30, the pixel controllers 22, and interconnecting conductive wires 50. The light-absorbing material 42 forms a layer of light-absorbing material 42 disposed at least partially between the inorganic light emitters 30 and at least partially over the pixel controllers 22 and electrical connections (conductive wires 50) in step 450. The light-absorbing material 42 of the second layer can at least partially obscure or occlude the light-emitting areas of the one or more inorganic light emitters 30. If any light-absorbing material occludes the light-emitting areas of the light emitters 30, it is removed, for example by etching optical vias 28 over the light-emitting areas of the light emitters 30, in the layer of light-absorbing material 420 in step 460.

In accordance with another embodiment of the present invention, the light-absorbing material 42 in the light-emitter layer 40 is at least partially electrically conductive. Since light-emitting diodes typically include several semiconductor layers that are also electrically conductive, if the electrically conductive light-absorbing material 42 is in contact with the semiconductor layers of the light-emitting diodes, the light-emitting diodes can be prevented from emitting light. To forestall such a problem, according to one embodiment of the present invention, the inorganic light emitters 30 include an electrically insulating layer (e.g., a dielectric layer) formed over the semiconductor layers and disposed between the semiconductor layers and the light-absorbing material 42. Electrical vias can be formed, as needed, in the electrically insulating layer to provide access to the semiconductor layers of the light-emitting diode. In another embodiment, the light-emitter layer includes an electrically insulating layer, for example over the light-absorbing material 42 and between the inorganic light emitters 30 and the light-absorbing layer 42. In yet another embodiment, an interlayer dielectric is formed between the inorganic light emitters 30 and the light-absorbing material 42.

In various methods of the present invention, the light emitters 30 are first disposed on the display substrate 10. If the light emitters 30 include an electrically insulating layer, the light-absorbing material can be coated over and around the light emitters 30. Electrical vias can be formed in the light-absorbing material 42 and the electrically insulating layer, as needed, for example to make electrical connections to the light emitter 30. In alternative methods of the present invention, the light-absorbing material 42 is first coated on the display substrate 10, optical vias are formed in the light-absorbing material 42, and an electrically insulating layer disposed over the light-absorbing material 42. The electrically insulating layer can be an interlayer dielectric or can be a sub-layer, together with the light-absorbing material, of the light-emitter layer 40. The light emitters 30 are then disposed in the optical vias, for example using micro transfer printing, and electrically connected using photolithography.

The first of these embodiments is shown, for example in FIG. 1. Referring to FIG. 32A, in an alternative embodiment the light-absorbing material 42 is first deposited on the display substrate 10 and optical vias are formed in the light-absorbing material 42. Dielectric layer 44 forms an interlayer dielectric over the light-absorbing material 42 and the optical vias into which the light emitters 30 are disposed, for example by micro-transfer printing. In this embodiment, the interlayer dielectric is at least partially transparent to light emitted by the light emitters 30 and is located at least partially between the display substrate 10 and the light-emitters 30. Referring to FIG. 32B, in another embodiment, the dielectric layer 44 in the optical via is removed and the light emitters 30 are located on the display substrate and flush with the light-absorbing material 42. In this case the dielectric layer 44 does not need to be transparent. An adhesive can be employed in the optical via to assist adhesion of the light emitters 30 to the display substrate 10 or dielectric layer 44.

The light-absorbing material 42 can extend beyond the height of the light emitters 30, can extend to the top of the light-emitters 30 as shown, or extend only partially to the top of the light-emitters 30. According to embodiments of the present invention, as long as portions of the light emitters 30 and the light-absorbing material 42 are in a common plane, the light-absorbing material is surrounding at least a portion of the inorganic light emitters.

As is understood by those skilled in the art, the terms "on," "over" and "under" are relative terms and can be interchanged in reference to different orientations of the layers, elements, and substrates included in the present invention. For example, a first layer on a second layer, in some implementations means a first layer directly on and in contact with a second layer. In other implementations, a first layer on a second layer includes a first layer and a second layer with another layer therebetween.

Having described certain implementations of embodiments, it will now become apparent to one of skill in the art that other implementations incorporating the concepts of the disclosure may be used. Therefore, the invention should not be limited to the described embodiment, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

A cross section line
B cross section line
5 inorganic-light-emitter display
10 display substrate
11 support substrate
12 display controller
14 anti-reflection layer
15 transparent adhesive layer
16 display substrate surface
18 removal layer
19 protective layer
20 pixel element
22 pixel controller
24 pixel substrate
26 via
28 optical via
30 light emitter
32 red light emitter
32A red-light-emissive area
34 green light emitter
34A green-light-emissive area
36 blue light emitter
36A blue-light-emissive area
40 light-emitter layer
42 light-absorbing material
42A second layer of light-absorbing material
44 dielectric layer 50 conductive wire
52 light absorber
54 dichroic filter
60 emitted light
62 incident ambient light
64 transmitted ambient light
100 provide display substrate step
102 provide pixel substrate step
105 provide light emitters step
107 provide pixel controller step
110 form wires on substrate step
120 print micro-LEDs on display substrate step
122 print micro-LEDs and pixel controller on display substrate step
124 print micro-LEDs and pixel controller on pixel substrate step
125 optional test pixel element step
126 print pixel substrate on display substrate step
130 form light-absorbing layer on display substrate step
140 form interconnects on light-absorbing material step
142 optional form interconnects on pixel substrate step
200 provide support substrate step
210 locate removal layer on support substrate step
220 print micro-LEDs on removal layer step
230 locate light-absorbing material removal layer step
240 form interconnects on light-absorbing material step
250 attach display substrate step
260 remove support substrate step
270 remove portion of removal layer step
280 apply protection layer step
290 apply optical enhancing elements step
310 coat display substrate with optically clear adhesive step
320 print micro-LEDs on adhesive layer step
330 coat light-absorbing material step
340 print pixel controllers on light-absorbing material step
350 interconnect pixel controllers to micro-LEDs step
410 coat display substrate with light-absorbing material step
420 print micro-LEDs on light-absorbing material layer step
430 print pixel controllers on light-absorbing material layer step
440 interconnect pixel controllers to micro-LEDs step
450 coat display substrate, pixel controllers, and micro-LEDs with light-absorbing material step
460 remove light-absorbing material from micro-LEDs step
510 print pixel controllers on display substrate step
520 print micro-LEDs on display substrate step

What is claimed:

1. An inorganic-light-emitter display, comprising:
a display substrate;
a plurality of spatially separated inorganic light emitters distributed on the display substrate in a light-emitter layer, wherein the plurality of light emitters emit light through the display substrate; and
a light-absorbing black-matrix material surrounding at least a portion of the plurality of inorganic light emitters in the light-emitter layer, wherein the light-absorbing material at least partially covers the display substrate, wherein each light emitter of the plurality of inorganic light emitters has a light-emissive area and wherein the combined light-emissive areas of the plurality of inorganic light emitters is less than or equal to one eighth of the light-absorbing material area.

2. The display of claim 1, comprising a transparent adhesive layer located between the display substrate and the plurality of spatially separated inorganic light emitters that adheres the spatially separated inorganic light emitters to the display substrate.

3. The display of claim 1, comprising one or more pixel controllers located at least partially over the light-absorbing material and electrically connected to the inorganic light emitters.

4. The display of claim 1, comprising one or more pixel controllers disposed on the display substrate, the pixel controllers connected to the inorganic light emitters with electrical connections, and the pixel controllers and the electrical connections located at least partially between the light-absorbing layer and the display substrate.

5. The display of claim 1, wherein the inorganic light emitters have light-emitting areas, the light-absorbing black-matrix material forms a light-absorbing layer that at least partially covers a top surface of the inorganic light emitters, and comprising optical vias in the light-absorbing layer, the optical vias located at least partially in correspondence with the light-emitting areas of the inorganic light emitters.

6. The display of claim 1, wherein the plurality of inorganic light emitters and the light-absorbing material are disposed on a common surface.

7. The display of claim 1, comprising:
one or more pixel controllers electrically connected to the plurality of spatially separated inorganic light emitters, each pixel controller distributed over the display substrate in the light-emitter layer, wherein the light-absorbing black-matrix material surrounds at least a portion of the one or more pixel controllers.

8. The display of claim 1, wherein the light-absorbing black-matrix material is in contact with the display substrate.

9. The display of claim 1, wherein the light-absorbing black-matrix material is in contact with the plurality of spatially separated inorganic light emitters.

10. The display of claim 1, comprising one or more pixel controllers located at least partially over and in contact with the light-absorbing material, wherein each electrically connected to the inorganic light emitters.

11. The display of claim 1, wherein the plurality of spatially separated inorganic light emitters are in contact with the display substrate.

12. An inorganic-light-emitter display, comprising:
a display substrate;
a plurality of spatially separated inorganic light emitters distributed on the display substrate in a light-emitter layer;
a light-absorbing black-matrix material surrounding at least a portion of the plurality of inorganic light emitters in the light-emitter layer, wherein the light-absorbing material at least partially covers the display substrate; and
one or more pixel controllers electrically connected to the plurality of spatially separated inorganic light emitters, each pixel controller distributed over the display substrate in the light-emitter layer, wherein the light-absorbing black-matrix material surrounds at least a portion of the one or more pixel controllers,
wherein each light emitter of the plurality of inorganic light emitters has a light-emissive area and wherein the combined light-emissive areas of the plurality of inorganic light emitters is less than or equal to one eighth of the light-absorbing material area.

13. The display of claim 12, wherein at least a portion of the light-absorbing black- matrix material is in contact with the display substrate.

14. The display of claim 12, wherein the light-absorbing black-matrix material is in contact with the plurality of spatially separated inorganic light emitters.

15. An inorganic-light-emitter display, comprising:
a display substrate;
a plurality of spatially separated inorganic light emitters distributed on or over the display substrate in a light-emitter layer;
a light-absorbing black-matrix material surrounding at least a portion of the plurality of inorganic light emitters in the light-emitter layer, wherein the light-absorbing material at least partially covers the display substrate; and
one or more pixel controllers electrically connected to the plurality of spatially separated inorganic light emitters, each pixel controller distributed on the display substrate in the light-emitter layer, wherein the light-absorbing black-matrix material at least partially covers the one or more pixel controllers and the one or more pixel controllers are in contact with the display substrate,
wherein each light emitter of the plurality of inorganic light emitters has a light-emissive area and wherein the combined light-emissive areas of the plurality of inorganic light emitters is less than or equal to one eighth of the light-absorbing material area.

* * * * *